US012575044B2

(12) United States Patent
Park et al.

(10) Patent No.: US 12,575,044 B2
(45) Date of Patent: Mar. 10, 2026

(54) FOLDABLE ELECTRONIC DEVICE INCLUDING NON-CONDUCTIVE MEMBER

(71) Applicant: SAMSUNG ELECTRONICS CO., LTD., Suwon-si (KR)

(72) Inventors: Jungsik Park, Suwon-si (KR); Woongeun Kwak, Suwon-si (KR); Jungchul An, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 458 days.

(21) Appl. No.: 18/095,145

(22) Filed: Jan. 10, 2023

(65) Prior Publication Data

US 2023/0225066 A1     Jul. 13, 2023

Related U.S. Application Data

(63) Continuation of application No. PCT/KR2022/017987, filed on Nov. 15, 2022.

(30) Foreign Application Priority Data

Jan. 10, 2022     (KR) ........................ 10-2022-0003583
Apr. 29, 2022     (KR) ........................ 10-2022-0053779

(51) Int. Cl.
H05K 5/02     (2006.01)
H05K 5/03     (2006.01)

(52) U.S. Cl.
CPC ............. H05K 5/0226 (2013.01); H05K 5/03 (2013.01)

(58) Field of Classification Search
CPC .... G06F 1/1652; G09F 9/301; H04M 1/0268; H05K 5/0226
See application file for complete search history.

(56) References Cited

U.S. PATENT DOCUMENTS

| | | | | |
|---|---|---|---|---|
| 10,929,637 B2 * | 2/2021 | Kim | .................... | G06V 40/1329 |
| 11,031,636 B2 * | 6/2021 | Cheong | ................. | H01M 50/55 |
| 11,243,564 B2 * | 2/2022 | Kim | ....................... | G06F 1/1681 |
| 11,276,874 B2 * | 3/2022 | Oh | ......................... | H01M 4/667 |

(Continued)

FOREIGN PATENT DOCUMENTS

| | | |
|---|---|---|
| CN | 113596208 A | 11/2021 |
| EP | 4024833 A1 | 7/2022 |

(Continued)

OTHER PUBLICATIONS

International Search Report dated Feb. 20, 2023 for PCT/KR2022/017987.

(Continued)

*Primary Examiner* — Rockshana D Chowdhury
*Assistant Examiner* — Douglas R Burtner
(74) *Attorney, Agent, or Firm* — Nixon & Vanderhye P.C.

(57) ABSTRACT

An electronic device may include a housing including a first housing and a second housing, a display disposed on the first housing and the second housing, a hinge structure connecting the first housing and the second housing, a conductive plate supporting the display, a non-conductive member surrounding at least a portion of the conductive plate and protruding with respect to the display, and a waterproofing member at least partially disposed between the non-conductive member and the housing.

20 Claims, 14 Drawing Sheets

(56) References Cited

U.S. PATENT DOCUMENTS

| | | | | |
|---|---|---|---|---|
| 11,425,833 | B2 * | 8/2022 | Kim | H05K 5/0017 |
| 11,432,410 | B2 * | 8/2022 | Woo | G06F 3/0421 |
| 11,540,387 | B2 * | 12/2022 | Oh | H05K 1/0215 |
| 12,101,902 | B2 * | 9/2024 | Kim | G02B 5/30 |
| 12,141,409 | B2 * | 11/2024 | Park | G06F 3/046 |
| 12,169,423 | B2 * | 12/2024 | An | G06F 1/1681 |
| 12,197,677 | B2 * | 1/2025 | Heo | G06F 3/045 |
| 12,395,582 | B2 * | 8/2025 | An | G06F 1/1658 |
| 2018/0375973 | A1 | 12/2018 | Song et al. | |
| 2019/0068764 | A1 | 2/2019 | Liu et al. | |
| 2020/0042133 | A1 * | 2/2020 | Park | G06F 3/016 |
| 2020/0236826 | A1 * | 7/2020 | Baek | H01F 27/366 |
| 2020/0319672 | A1 * | 10/2020 | Kim | G06F 1/1656 |
| 2021/0029841 | A1 * | 1/2021 | Kim | H04M 1/0216 |
| 2021/0105894 | A1 * | 4/2021 | Oh | H05K 1/0281 |
| 2021/0116964 | A1 | 4/2021 | Moon et al. | |
| 2021/0280826 | A1 | 9/2021 | Kim et al. | |
| 2022/0043481 | A1 * | 2/2022 | Shin | G06F 1/1616 |
| 2022/0044599 | A1 * | 2/2022 | La | G06F 1/1641 |
| 2022/0103672 | A1 * | 3/2022 | Jung | G02F 1/133331 |
| 2022/0129094 | A1 * | 4/2022 | Tatsuno | G06F 1/1641 |
| 2022/0183174 | A1 * | 6/2022 | Bae | G06F 1/1641 |
| 2022/0217863 | A1 * | 7/2022 | Kim | G06F 1/1656 |
| 2022/0346241 | A1 | 10/2022 | Sunwoo et al. | |
| 2023/0027714 | A1 * | 1/2023 | Lee | G06F 1/1677 |
| 2023/0044193 | A1 * | 2/2023 | Park | G06F 3/0445 |
| 2023/0044990 | A1 * | 2/2023 | Park | F16C 11/045 |
| 2023/0047246 | A1 * | 2/2023 | An | G06F 1/1652 |
| 2023/0051260 | A1 * | 2/2023 | An | H04M 1/0268 |
| 2023/0079135 | A1 * | 3/2023 | Park | H04M 1/0214 |
| | | | | 361/679.27 |
| 2023/0127293 | A1 * | 4/2023 | An | G01N 27/20 |
| 2023/0180413 | A1 * | 6/2023 | An | G06F 3/041 |
| | | | | 345/905 |
| 2023/0336648 | A1 * | 10/2023 | Lee | H01Q 21/28 |
| 2024/0309244 | A1 * | 9/2024 | Rim | C08J 7/04 |
| 2025/0056748 | A1 * | 2/2025 | Cho | H04M 1/0216 |

FOREIGN PATENT DOCUMENTS

| | | | |
|---|---|---|---|
| JP | 2005-019082 | A | 1/2005 |
| KR | 10-2018-0031424 | A | 3/2018 |
| KR | 10-2020-0038535 | A | 4/2020 |
| KR | 10-2021-0040699 | A | 4/2021 |
| KR | 10-2021-0047753 | A | 4/2021 |
| KR | 10-2021-0101462 | A | 8/2021 |
| KR | 10-2021-0150942 | A | 12/2021 |
| KR | 10-2021-0152910 | A | 12/2021 |

OTHER PUBLICATIONS

PCT Written Opinion dated Feb. 20, 2023 for PCT/KR2022/017987.

Extended European Search Report dated Dec. 2, 2024 for EP Application No. 22919000.4.

* cited by examiner

1010

1020

1030

FOLDABLE ELECTRONIC DEVICE INCLUDING NON-CONDUCTIVE MEMBER

CROSS-REFERENCE TO RELATED APPLICATIONS

This application is a continuation of International Application No. PCT/KR2022/017987, filed Nov. 15, 2022, designating the United States, in the Korean Intellectual Property Receiving Office, and claiming priority to KR Patent Application No. 10-2022-0003583, filed Jan. 10, 2022, and to KR Patent Application No. 10-2022-0053779, filed Apr. 29, 2022, the disclosures of which are all hereby incorporated by reference herein in their entireties.

BACKGROUND

Field

The disclosure relates to a foldable electronic device including a non-conductive member.

Description of Related Art

With the development of information and communication technology and semiconductor technology, various functions are being integrated into one portable electronic device. For example, an electronic device may implement not only communication functions but also entertainment functions, such as playing games, multimedia functions, such as playing music and videos, communication and security functions for mobile banking, and scheduling and e-wallet functions. Such electronic devices become compact enough for users to carry in a convenient way.

As mobile communication services extend up to multimedia service sectors, electronic devices require a larger display to allow users satisfactory use of multimedia services as well as voice call or text messaging services. This, however, trades off the trend of electronic devices being compact.

SUMMARY

According to an example embodiment, an electronic device may comprise a housing including a first housing and a second housing, a display disposed on, directly or indirectly, the first housing and the second housing, a hinge structure connecting, directly or indirectly, the first housing and the second housing, a conductive plate supporting the display, a non-conductive member surrounding at least a portion of the conductive plate and protruding with respect to the display, and a waterproofing member at least partially disposed between the non-conductive member and the housing.

According to an example embodiment, an electronic device may comprise a housing including a first housing and a second housing, a display including a first display area disposed on, directly or indirectly, the first housing, a second display area disposed on, directly or indirectly, the second housing, and a folding area positioned between the first display area and the second display area, a support sheet supporting the display and including at least one opening facing the folding area, a digitizer disposed under the support sheet, a conductive plate disposed under the digitizer, a non-conductive member surrounding at least a portion of the conductive plate, and a waterproofing member at least partially disposed between the non-conductive member and the housing. The non-conductive member may be disposed further adjacent, or closer, to a side surface of the housing than the support sheet or the non-conductive member.

BRIEF DESCRIPTION OF THE DRAWINGS

The above and other aspects, features, and advantages of certain embodiments will be more apparent from the following detailed description, taken in conjunction with the accompanying drawings.

DETAILED DESCRIPTION

Figure 1:
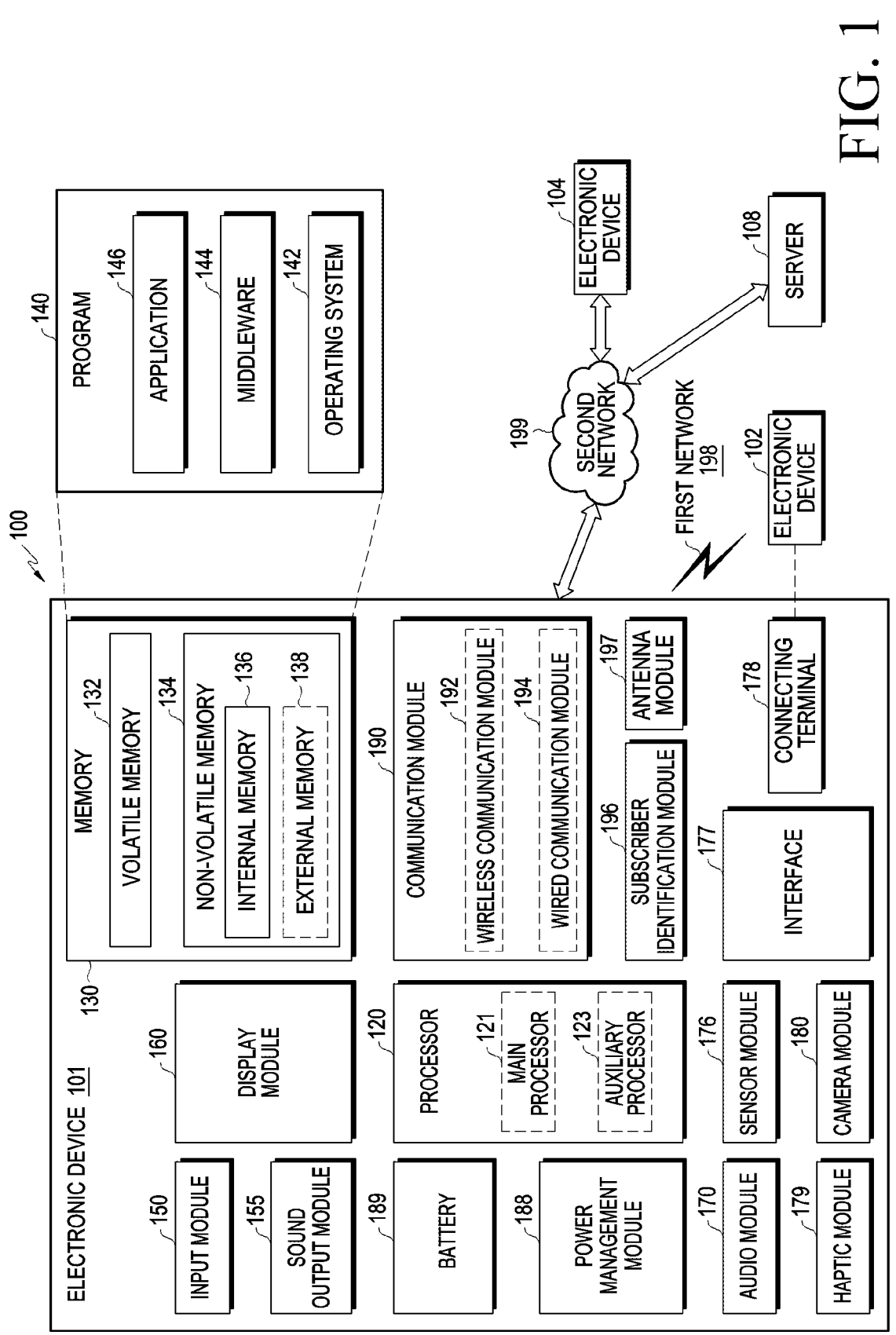
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. Non-volatile memory may include internal memory 136 and/or external memory 138). According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of Ims or less) for implementing URLLC.

The antenna module 197 may transmit or receive a signal or power to or from the outside (e.g., the external electronic device). According to an embodiment, the antenna module may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to an embodiment, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to an embodiment of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that an embodiment of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via at least a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities. Some of the plurality of entities may be separately disposed in different components. According to an embodiment, one or more of the above-described components may be omitted, or one or more other components may be added. Alternatively or additionally, a plurality of components (e.g., modules or programs) may be integrated into a single component. In such a case, according to an embodiment, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2:
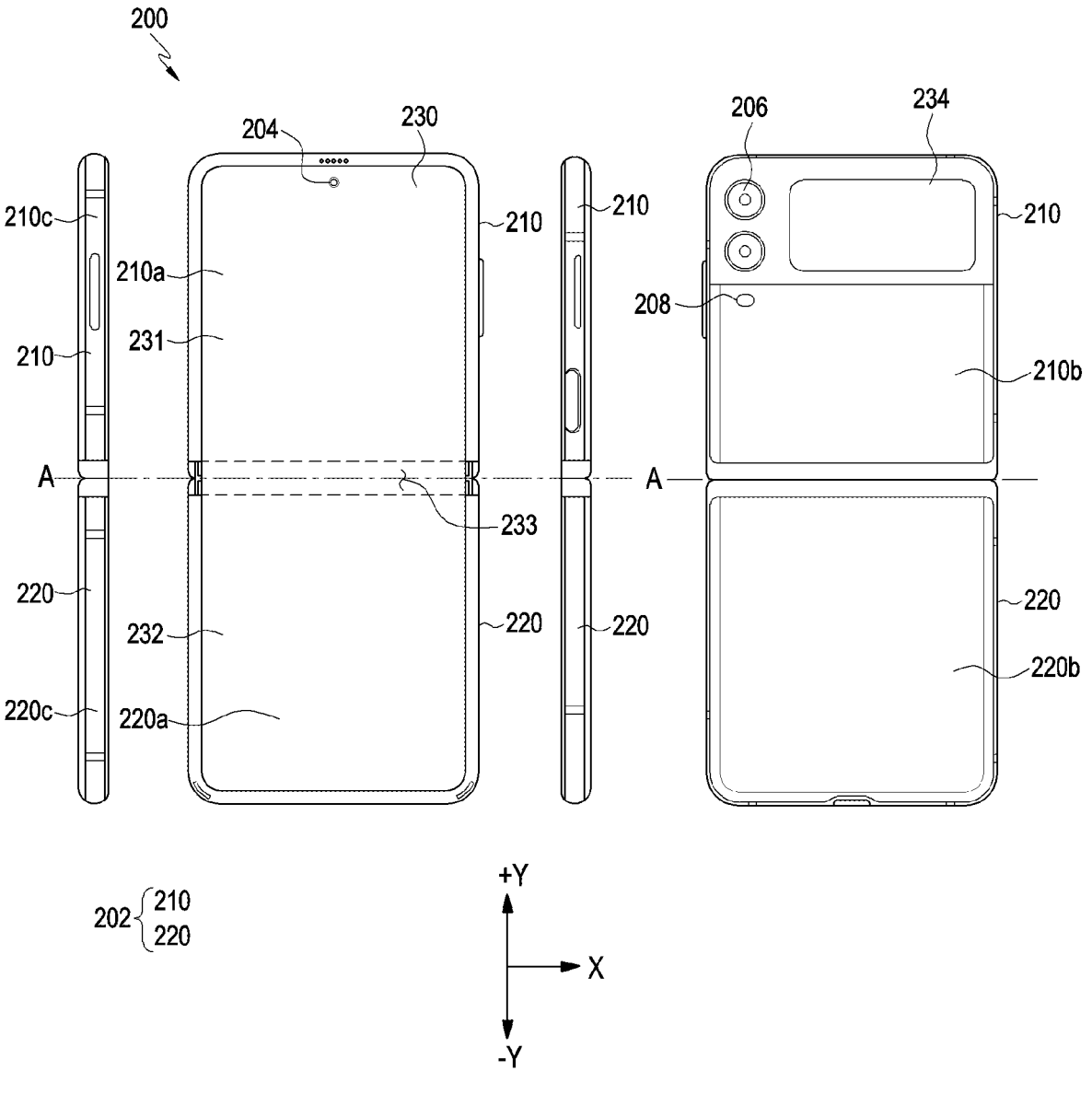
FIG. 2 is a view illustrating an unfolded state of an electronic device according to an embodiment of the disclosure.
Figure 3:
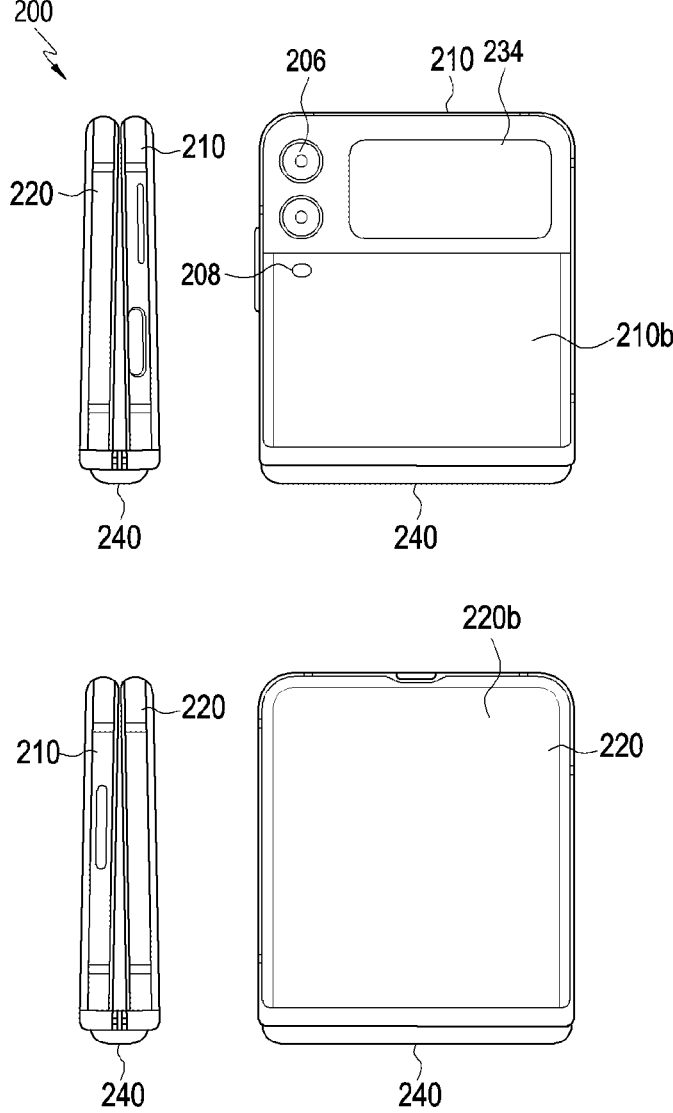
FIG. 3 is a view illustrating a folded state of an electronic device according to an embodiment of the disclosure.

FIG. 2 is a view illustrating an unfolded state of an electronic device according to an embodiment of the disclosure. FIG. 3 is a view illustrating a folded state of an electronic device according to an embodiment of the disclosure. The configuration of the electronic device 200 of FIGS. 2 and 3 may be identical in whole or part to the configuration of the electronic device 101 of FIG. 1.

Referring to FIGS. 2 and 3, an electronic device 200 may include a housing 202 for receiving a component (e.g., the hinge structure 280 of FIG. 4) of the electronic device 200 and a flexible display or foldable display 230 (hereinafter, display 230) disposed in the space formed by the housing 202. According to an embodiment, the housing 202 may be referred to as a foldable housing.

According to an embodiment, the housing 202 may include a first housing 210 and a second housing 220 configured to rotate about the first housing 210.

According to an embodiment, the first housing 210 and/or the second housing 220 may form a portion of the exterior of the electronic device 200. According to an embodiment, the surface where the display 230 is visually exposed may be a front surface (e.g., a first front surface 210a and a second front surface 220a) of the electronic device 200 and/or housing 202. A surface opposite to the front surface may be a rear surface (e.g., a first rear surface 210b and a second rear surface 220b) of the electronic device 200. A surface surrounding at least a portion of the space between the front surface and the rear surface may be a side surface (e.g., the first side surface 210c and the second side surface 220c) of the electronic device 200.

Figure 4:
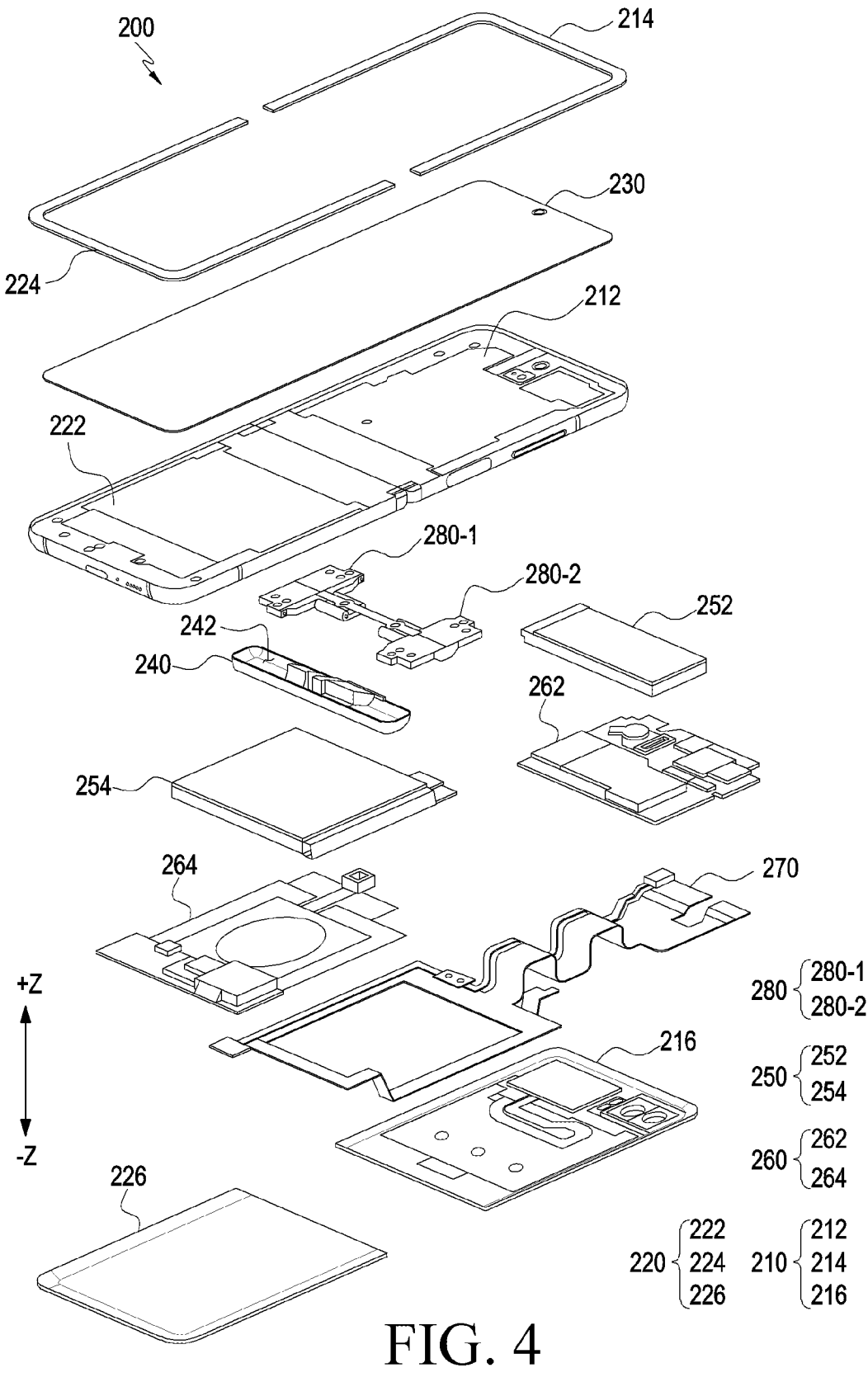
FIG. 4 is an exploded perspective view illustrating an electronic device according to an embodiment of the disclosure.

According to an embodiment, the first housing 210 may be rotatably connected, directly or indirectly, to the second housing 220 by a hinge structure (e.g., the hinge structure 280 of FIG. 4). For example, the first housing 210 and the second housing 220 may be connected, directly or indirectly, to each other to be rotatable about the hinge structure 280. Thus, the electronic device 200 may turn into a folded state (e.g., FIG. 3) or unfolded state (e.g., FIG. 2). In the folded state of the electronic device 200, the first front surface 210a may face the second front surface 220a and, in the unfolded state, the direction in which the first front surface 210a faces may be the same as the direction in which the second front surface 220a faces. For example, in the unfolded state, the first front surface 210a may be positioned on substantially the same plane as the second front surface 220a. According to an embodiment, the second housing 220 may provide a motion relative to the first housing 210.

According to an embodiment, the first housing 210 and the second housing 220 are disposed on both sides of the folding axis A and be overall symmetrical in shape with respect to the folding axis A. The angle between the first housing 210 and the second housing 220 may be changed depending on whether the electronic device 200 is in the unfolded state, the folded state, or an intermediate state between the unfolded state and the folded state.

According to an embodiment, the electronic device 200 may include a hinge cover 240. At least a portion of the hinge cover 240 may be disposed between the first housing 210 and the second housing 220. According to an embodiment, the hinge cover 240 may be hidden by a portion of the first housing 210 and second housing 220 or be exposed to the outside depending on the state of the electronic device 200. According to an embodiment, the hinge cover 240 may protect the hinge structure (e.g., the hinge structure 280 of FIG. 4) from an external impact of the electronic device 200. According to an embodiment, the hinge cover 240 may be interpreted as a hinge housing for protecting the hinge structure 280.

According to an embodiment, as shown in FIG. 2, in the unfolded state of the electronic device 200, the hinge cover 240 may be hidden, and thus not exposed, by the first housing 210 and the second housing 220. As another example, as shown in FIG. 3, in the folded state (e.g., a fully folded state) of the electronic device 200, the hinge cover 240 may be exposed to the outside between the first housing 210 and the second housing 220. As another example, in an intermediate state in which the first housing 210 and the second housing 220 are folded with a certain angle, the hinge cover 240 may be partially exposed to the outside between the first housing 210 and the second housing 220. In this case, however, the exposed area may be smaller than in the fully folded state. According to an embodiment, the hinge cover 240 may include a curved surface.

According to an embodiment, the display 230 may visually provide information to the outside (e.g., the user) of the electronic device 200. The display 230 may include, for example, a hologram device, or a projector and control circuitry to control a corresponding one of the display, hologram device, and projector. According to an embodiment, the display 230 may include a touch sensor configured to detect a touch, or a pressure sensor configured to measure the intensity of a force generated by the touch.

According to an embodiment, the display 230 may include a display at least a portion of which may be transformed into a flat or curved surface. For example, the display 230 may be formed to be transformable in response to the motion of the second housing 220 relative to the first housing 210. According to an embodiment, the display 230 may include a folding area 233, a first display area 231 disposed on, directly or indirectly, one side of the folding area 233 (e.g., the upper (+Y) direction), and a second display area 232 disposed, directly or indirectly, on the opposite side of the folding area 233 (e.g., lower (−Y) direction). According to an embodiment, the folding area 233 may be formed over the hinge structure (e.g., the hinge structure 280 of FIG. 4). For example, at least a portion of the folding area 233 may face the hinge structure 280. According to an embodiment, the first display area 231 may be disposed on, directly or indirectly, the first housing 210, and the second display area 232 may be disposed on, directly or indirectly, the second housing 220. According to an embodiment, the display 230 may be received in the first housing 210 and the second housing 220. Each "hinge structure" herein comprises at least one hinge.

However, the segmentation of the display 230 as shown in FIG. 2 is merely an example, and the display 230 may be divided into a plurality of (e.g., four or more, or two) areas depending on the structure or function of the display 200.

Further, in the embodiment illustrated in FIG. 2, the area of the display 230 may be segmented by the folding area 233 or folding axis (axis A) extending in parallel with the X axis but, in an embodiment, the display 230 may also be segmented with respect to other folding area (e.g., a folding area parallel with the Y axis) or other folding axis (e.g., a folding axis parallel with the Y axis). According to an embodiment, the display 230 may be coupled with or disposed adjacent to a touch detection circuit, a pressure sensor capable of measuring the strength (pressure) of touches, and/or a digitizer for detecting a magnetic field-type stylus pen.

According to an embodiment, the electronic device 200 may include a rear display 234. The rear display 234 may be disposed to face in a different direction from the display 230. For example, the display 230 may be visually exposed through the front surface (e.g., the first front surface 210a and/or the second front surface 220a) of the electronic device 200, and the rear display 234 may be visually exposed through the rear surface (e.g., the first rear surface 210b) of the electronic device 200.

According to an embodiment, the electronic device 200 may include at least one camera module 204 and 206 and a flash 208. According to an embodiment, the electronic device 200 may include a front camera module 204 exposed through the front surface (e.g., the first front surface 210a) and/or a rear camera module 206 exposed through the rear surface (e.g., the first rear surface 220b). The camera modules 204 and 206 may include one or more lenses, an image sensor, a flash, and/or an image signal processor. The flash 208 may include a light emitting diode (LED) or a xenon lamp. According to an embodiment, two or more lenses (an infrared (IR) camera, a wide-angle lens, and a telephoto lens) and image sensors may be disposed on, directly or indirectly, one surface of the electronic device 200. The configuration of the front camera module 204 and/or rear camera module 206 may be identical in whole or part to the configuration of the camera module 180 of FIG. 1. Each camera module herein comprises at least one lens and/or circuitry. Each "module" herein may comprise circuitry.

FIG. 4 is an exploded perspective view illustrating an electronic device according to an embodiment of the disclosure.

Referring to FIG. 4, an electronic device 200 may include a first housing 210, a second housing 220, a display 230, a hinge cover 240, a battery 250, a printed circuit board 260, a flexible printed circuit board 270, and a hinge structure 280. The configuration of the first housing 210, the second housing 220, the display 230, and the hinge cover 240 of FIGS. 3 and 4 may be identical in whole or part to the configuration of the first housing 210, the second housing 220, the display 230, and the hinge cover 240 of FIGS. 2 and/or 3.

According to an embodiment, the electronic device 200 may include a first supporting member 212 or a second supporting member 222. For example, the first housing 210 may include a first supporting member 212, and the second housing 220 may include a second supporting member 222. According to an embodiment, the first supporting member 212 and/or the second supporting member 222 may support components (e.g., the display 230, the battery 250, and the printed circuit board 260) of the electronic device 200.

According to an embodiment, the first supporting member 212 and/or the second supporting member 222 may be formed of a metal material and/or a non-metal (e.g., polymer) material. According to an embodiment, the first supporting member 212 may be disposed between the display 230 and the battery 250. For example, the display 230 may be coupled to one surface of the first supporting member 212, and the battery 250 and the printed circuit board 260 may be disposed on, directly or indirectly, the other surface.

According to an embodiment, the electronic device 200 may include a first protection member 214 or a second protection member 224. For example, the first housing 210 may include a first protection member 214, and the second housing 220 may include a second protection member 224. According to an embodiment, the protection members 214 and 224 may protect the display 230 from external impact. For example, the first protection member 214 may surround at least a portion of a portion (e.g., the first display area 231 of FIG. 1) of the display 230, and the second protection member 224 may surround at least a portion of another portion (e.g., the second display area 232 of FIG. 1) of the display 230. According to an embodiment, the first protection member 214 may be referred to as a first deco member, and the second protection member 224 may be referred to as a second deco member.

According to an embodiment, the housings 210 and 220 may include a first rear plate 216 and a second rear plate 226. For example, the first housing 210 may include a first rear plate 216 connected, directly or indirectly, to the first supporting member 212, and the second housing 220 may include a second rear plate 226 connected, directly or indirectly, to the second supporting member 222. According to an embodiment, the rear plates 216 and 226 may form at least a portion of the exterior of the electronic device 200. For example, the first rear plate 216 may form a first rear surface (e.g., the first rear surface 210*b* of FIG. 2), and the second rear plate 226 may form a second rear surface (e.g., the second rear surface 220*b* of FIG. 2). According to an embodiment, the first battery 252 and the first printed circuit board 262 may be disposed between the first supporting member 212 and the first rear plate 216. The second battery 254 and the second printed circuit board 264 may be disposed between the second supporting member 222 and the second rear plate 226.

According to an embodiment, the hinge cover 240 may receive at least a portion of the hinge structure 280. For example, the hinge cover 240 may include a receiving recess 242 for receiving the hinge structure 280. According to an embodiment, the hinge cover 240 may be coupled to the hinge structure 280. According to an embodiment, in the unfolded state of the electronic device 200, at least a portion of the hinge cover 240 may be positioned between the hinge structure 280 and the housings 210 and 220.

According to an embodiment, the battery 250 may be a device for supplying power to at least one component of the electronic device 200. The battery 189 may include a primary cell which is not rechargeable, a secondary cell which is rechargeable, or a fuel cell. The battery 250 may be integrally or detachably disposed inside the electronic device 200. According to an embodiment, the battery 250 may include a first battery 252 disposed in the first housing 210 and a second battery 254 disposed in the second housing 220. For example, the first battery 252 may be disposed on the first supporting member 212. The second battery 254 may be disposed on, directly or indirectly, the second supporting member 222.

According to an embodiment, a processor (e.g., the processor 120 of FIG. 1), a memory (e.g., the memory 130 of FIG. 1), and/or an interface (e.g., the interface 177 of FIG.

1) may be mounted on the printed circuit board 260. According to an embodiment, the printed circuit board 260 may include a first printed circuit board 262 disposed in the first housing 210 and a second printed circuit board 264 disposed in the second housing 220.

According to an embodiment, the flexible printed circuit board 270 may electrically connect a component (e.g., first printed circuit board 262) positioned in the first housing 210 with a component (e.g., second printed circuit board 264) positioned in the second housing 220. According to an embodiment, at least a portion of the flexible printed circuit board 270 may cross the hinge cover 240 and/or the hinge structure 280. For example, a portion of the flexible printed circuit board 270 may be disposed in the first housing 210, and another portion thereof may be disposed in the second housing 220. According to an embodiment, the flexible printed circuit board 270 may include a part 272 connected to an antenna and other part connected to the display 230.

According to an embodiment, the hinge structure 280 may be connected, directly or indirectly, to the first housing 210 and the second housing 220. According to an embodiment, the first housing 210 may rotate about the second housing 220 by the hinge structure 280. According to an embodiment, the hinge structure 280 may rotatably connect the first housing 210 and the second housing 220 from a folded state (e.g., FIG. 3) to an unfolded state (e.g., FIG. 2).

According to an embodiment, the hinge structure 280 may include a plurality of hinge structures 280-1 and 280-2 disposed in parallel. For example, the hinge structure 280 may include a first hinge structure 280-1 and a second hinge structure 280-2 spaced apart from the first hinge structure 280-1. According to an embodiment, the first hinge structure 280-1 may be symmetrical with the second hinge structure 280-2 with respect to the length direction (e.g., the Y-axis direction) of the electronic device 200.

Each embodiment herein may be used in combination with any other embodiment described herein.

Figure 5:
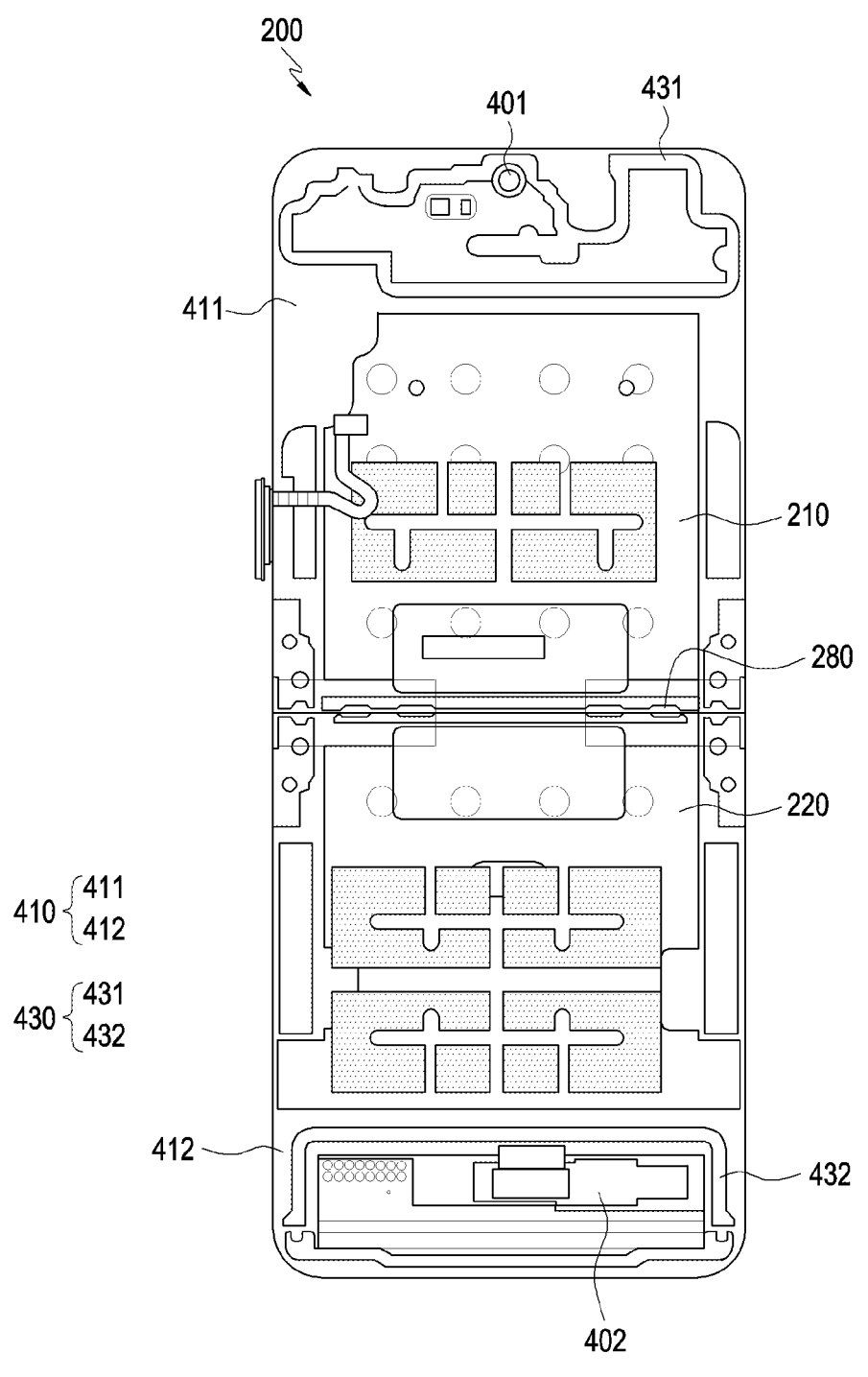
FIG. 5 is a front view illustrating an electronic device except for a display according to an embodiment of the disclosure.
Figure 6:
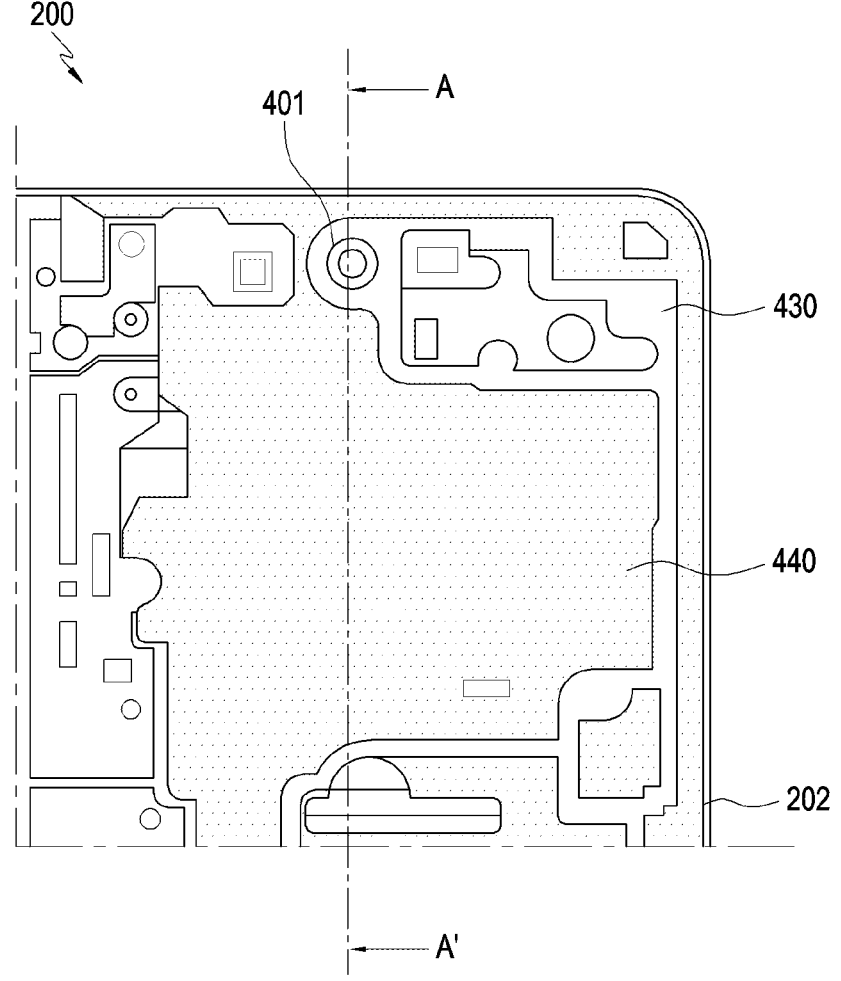
FIG. 6 is an enlarged, front view illustrating an electronic device according to an embodiment of the disclosure.
Figure 7:
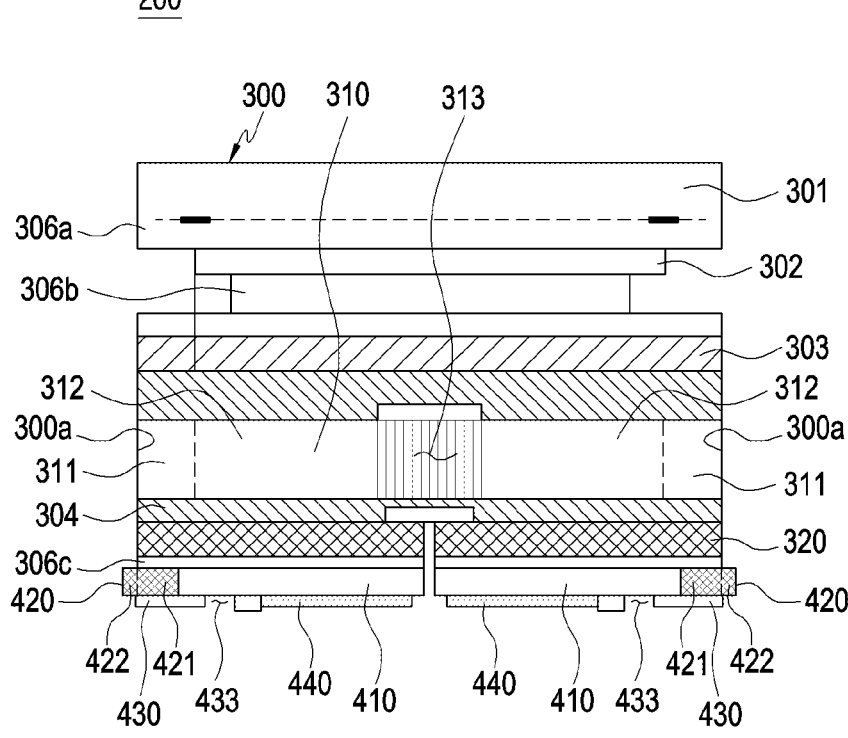
FIG. 7 is a cross-sectional view illustrating an electronic device according to an embodiment of the disclosure.
Figure 8:
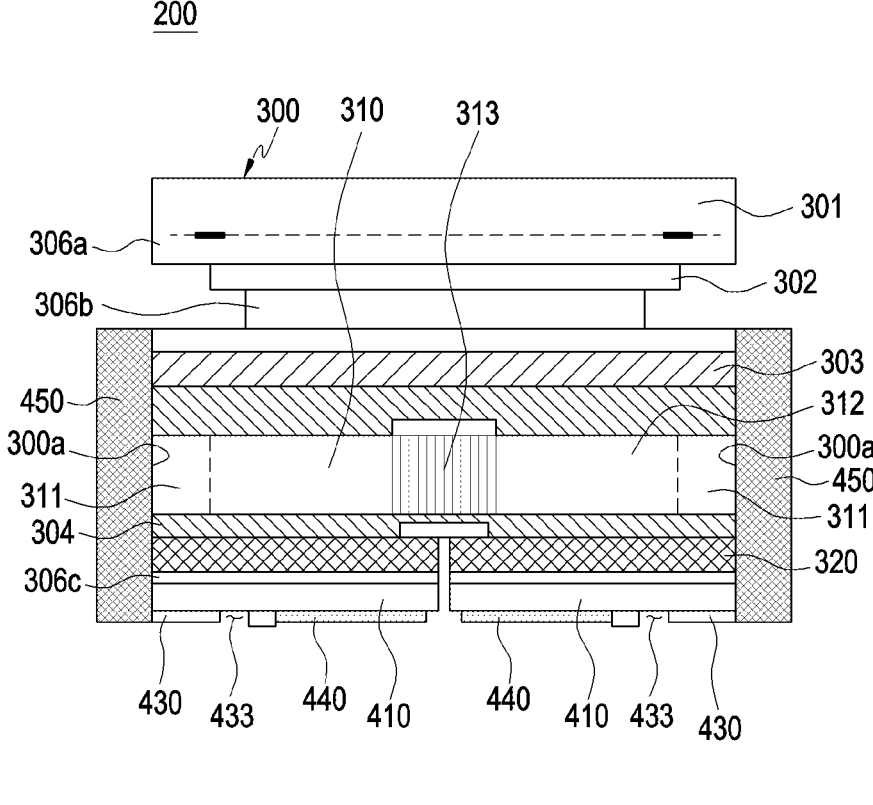
FIG. 8 is a cross-sectional view illustrating an electronic device according to an embodiment of the disclosure.

FIG. 5 is a front view illustrating an electronic device except for a display according to an embodiment of the disclosure. FIG. 6 is an enlarged, front view illustrating an electronic device according to an embodiment of the disclosure. FIG. 7 is a cross-sectional view illustrating an electronic device according to an embodiment of the disclosure. FIG. 8 is a cross-sectional view illustrating an electronic device according to an embodiment of the disclosure. For example, FIG. 7 and/or FIG. 8 is a cross-sectional view taken along line A-A' of FIG. 6.

Referring to FIGS. 5 and/or 6, the electronic device 200 may include a housing 202 including a first housing 210 and/or a second housing 220, a hinge structure 280, and a camera module 401. The configuration of the housing 202 and the camera module 401 of FIGS. 5 and/or 6 may be identical in whole or part to the configuration of the housing 202 and the camera module 204 of FIG. 2. The configuration of the hinge structure 280 of FIGS. 5 and/or 6 may be identical in whole or part to the configuration of the hinge structure 280 of FIG. 4. Conductive plate 410 may include multiple portions, such as 411 and/or 412.

Referring to FIGS. 7 and/or 8, the electronic device 200 may include a display 300, a conductive plate 410, nonconductive members 420 and 450, and a waterproofing member 430. The configuration of the display 300 of FIG. 7 may be identical in whole or part to the configuration of the display 230 of FIG. 2.

According to an embodiment, the display 300 may include a protective film 301, a window member 302, a display panel 303, and adhesives 306*a*, 306*b*, and 306*c*.

According to an embodiment, the protective film 301 may protect the outer surface of the display 300. According to an embodiment, at least a portion of the protective film 301 may be formed of a substantially transparent and flexible material. According to an embodiment, the protective film 301 may be referred to as a protective layer.

According to an embodiment, at least a portion of the window member 302 may be formed of a substantially transparent and flexible material. For example, the window member 302 may include an ultra-thin glass (UTG) and/or a polyimide film. The display panel 303 may be visually exposed to the outside of the electronic device 200 through the window member 302. According to an embodiment, the window member 302 may be connected to the display panel 303 by the second adhesive 306*b*.

According to an embodiment, the display panel 303 may display visual information. For example, the display panel 303 may include at least one light emitting element and provide light to the outside of the electronic device 200. According to an embodiment, the display panel 303 may include a panel, a protective film supporting the panel, and/or a substrate disposed under the protective film. According to an embodiment, the display panel 303 may include a thin film encapsulation layer, an organic light emitting layer, and/or low-temperature polysilicon.

According to an embodiment, the display 300 may include a support sheet 310 supporting at least a portion of the display panel 303. According to an embodiment, the support sheet 310 may reinforce the rigidity of the electronic device 200 and shield ambient noise. According to an embodiment, the support sheet 310 may dissipate at least a portion of the heat emitted from the heat dissipation component (e.g., the processor 120 of FIG. 1).

According to an embodiment, the support sheet 310 may be formed of a conductive material. For example, the support sheet 310 may include a metal (e.g., aluminum and/or stainless steel). As another example, the support sheet 310 may include carbon fiber reinforced plastics (CFRP). According to an embodiment, the electrical conductivity of the support sheet 310 may be higher than that of the non-conductive member 420.

According to an embodiment, the support sheet 310 may include at least one opening 313. The opening 313 may be referred to as an empty space formed in a position corresponding to the folding area (e.g., the folding area 233 of FIG. 2) of the display 300. According to an embodiment, the flexibility of the support sheet 310 may be increased by the opening 313. According to an embodiment, the opening 313 may be interpreted as a through hole or a lattice structure.

According to an embodiment, the display 300 may include a cushion member 304 supporting at least a portion of the support sheet 310. According to an embodiment, the cushion member 304 may absorb at least a portion of the impact applied to the display 300 from the outside of the electronic device 200. The protection and/or cushion member 304 may include thermoplastic polyurethane.

According to an embodiment, the electronic device 200 and/or the display 300 may include a digitizer 320. The digitizer 320 may detect a magnetic field type of stylus pen. For example, the digitizer 320 may include a substrate for detecting the magnetic field generated by interaction (e.g., electromagnetic induction) with a coil positioned in the stylus. According to an embodiment, the digitizer 320 may be disposed on, directly or indirectly, the conductive plate 410. According to an embodiment, the digitizer 320 may be disposed between the support sheet 310 and the conductive plate 410. According to an embodiment, the digitizer 320 may include a plurality of digitizers. For example, the digitizer 320 may include a first digitizer disposed on a first housing (e.g., the first housing 210 of FIG. 5) and a second digitizer spaced apart from the first digitizer and disposed on the second housing (e.g., the second housing 220 of FIG. 5).

According to an embodiment, the electronic device 200 may include a conductive plate 410. The conductive plate 410 may reduce deformation of the display 300. For example, the conductive plate 410 may have a rigidity larger than or equal to a designated value and support at least a portion of the display 300. For example, the conductive plate 410 may be disposed under the digitizer 320.

According to an embodiment, the conductive plate 410 may be formed of a conductive material. For example, the support sheet 310 may be of or include a metal (e.g., aluminum and/or stainless steel). As another example, the support sheet 310 may include carbon fiber reinforced plastics (CFRP). According to an embodiment, the electrical conductivity of the conductive plate 410 may be higher than that of the non-conductive member 420. According to an embodiment, the support sheet 310 may include a plurality of support sheets. For example, the support sheet 310 may include a first support sheet disposed on, directly or indirectly, a first housing (e.g., the first housing 210 of FIG. 5) and a second support sheet spaced apart from the first support sheet and disposed, directly or indirectly, on the second housing (e.g., the second housing 220 of FIG. 5).

According to an embodiment, the edge of the conductive plate 410 may be disposed inside the edge of another component (e.g., the support sheet 310) of the display 300. The edge of the support sheet 310 may protrude beyond (e.g., in the Y-axis direction or the X-axis direction) the edge of the conductive plate 410. For example, in an electronic device that is folded in the X-axis direction (e.g., FIG. 2), the edge of the support sheet 310 may protrude beyond the edge of the conductive plate 410 in the Y-axis direction. As another example, in an electronic device that is folded in the Y-axis direction (e.g., FIG. 12), the edge of the support sheet 310 may protrude beyond the edge of the conductive plate 410 in the X-axis direction.

According to an embodiment, the support sheet 310 may include a first support sheet area 311 forming a portion of the exterior of the support sheet 310 and a second support sheet area at least partially surrounded by the first support sheet area 311. According to an embodiment, a portion of the support sheet 310 that does not face the conductive plate 410 may be referred to as a first support sheet area 311, and a portion of the support sheet 310 facing the conductive plate 410 may be referred to as a second support sheet area 312. For example, the first support sheet area 311 may face the non-conductive member 420.

According to an embodiment, the electronic device 200 may include a non-conductive member 420. According to an embodiment, the non-conductive member 420 may include an injection-molded product (e.g., a resin and/or plastic) and/or a non-conductive tape.

According to an embodiment, the non-conductive member 420 may prevent or reduce damage to the display 300. For example, the edge of the non-conductive member 420 may protrude with respect to the display 300. The non-conductive member 420 protrudes in the lateral direction (e.g., the Y-axis direction) with respect to other components (e.g., the support sheet 310 and/or the protection plate 410) of the display 300, so that damage to the display 300 may be prevented or reduced.

According to an embodiment, the non-conductive member 420 may be disposed more adjacent to the side surface (e.g., the first side surface 210c and/or the second side surface 220c) of the housing (e.g., the housing 202 of FIG. 2) than the conductive plate 410 and/or the support sheet 310.

According to an embodiment, the non-conductive member 420 may block or reduce moisture introduced into the electronic device 200. For example, the non-conductive member 420 may be connected to the conductive plate 410 and surround at least a portion of the conductive plate 410.

According to an embodiment, the non-conductive member 420 may be disposed adjacent to the antenna. For example, the non-conductive member 420 may face at least a portion of a housing (e.g., housing 202 of FIG. 9) electrically connected, directly or indirectly, to the antenna module (e.g., antenna module 197 of FIG. 1, including at least one antenna). According to an embodiment, the non-conductive member 420 may be positioned between at least a portion of the housing 202 used as an antenna and at least a portion of the display 300.

According to an embodiment, the non-conductive member 420 may prevent or reduce degradation of the antenna performance of the electronic device 200. For example, moisture introduced into the empty space (e.g., the first space g1 of FIG. 9) between the display 300 and the housing 202 may be reduced by the non-conductive member 420, and changes in conductive paths for operation of the antenna module (e.g., antenna module 197 of FIG. 1, including at least one antenna) may be reduced. Changes in ground distance and/or frequency due to introduced moisture may be reduced. According to an embodiment, the non-conductive member 420 may surround at least a portion of a side surface of the display 300.

According to an embodiment, the electrical conductivity of the non-conductive member 420 may be lower than that of the conductive plate 410. According to an embodiment, the non-conductive member 420 may include an organic material-based polymer material (e.g., plastic). For example, the non-conductive member 420 may include epoxy.

According to an embodiment, the non-conductive member 420 may be designed to have various positions.

Referring to FIG. 7, the non-conductive member 420 may surround at least a portion of the conductive plate 410. According to an embodiment, the non-conductive member 420 may include a first portion 421 supporting the display 300 and a second portion 422 extending from the first portion 421. For example, the first portion 421 may face the display 300, and the second portion 422 may not face the display 300. According to an embodiment, the second portion 422 may protrude with respect to the display 300. For example, the second portion 422 may protrude with respect to other components of the display 300 (e.g., the support sheet 310 and/or the display panel 303). According to an embodiment, the first portion 421 may be referred to as an area overlapping a portion of the display 300, and the second portion 422 may be referred to as an area not overlapping the display 300.

Referring to FIG. 8, the non-conductive member 450 may cover at least a portion of the side surface 300a of the display 300. For example, the non-conductive member 450 may cover the display panel 303, the support sheet 310, and/or the digitizer 320. According to an embodiment, the non-conductive member 450 may surround the display 300. The non-conductive member 450 may protrude beyond the support sheet 310 and/or the conductive plate 410 in a lateral direction (e.g., Y-axis direction) of the electronic device 200. According to an embodiment, the electronic device 200 may include a waterproofing member 430. The waterproofing member 430 may block or reduce moisture introduced into the electronic device 200. According to an embodiment, at least a portion of the waterproofing member 430 may be disposed between the housing 202 and the non-conductive member 420, 450. According to an embodiment, the waterproofing member may include a waterproofing tape. The configuration of the non-conductive member 450 of FIG. 8 may be identical in whole or part to the configuration of the non-conductive member 420 of FIG. 7.

According to an embodiment, the waterproofing member 430 may be attached to the conductive plate 410 and the non-conductive member 420. For example, the waterproofing member 430 may be disposed under the conductive plate 410 and the non-conductive member 420 (e.g., −Z-axis direction).

According to an embodiment, the waterproofing member 430 may include a plurality of waterproofing members 431 and 432 spaced apart from each other. For example, the waterproofing member 430 may include a first waterproofing member 431 disposed on, directly or indirectly, the first housing 210 and a second waterproofing member 432 disposed on, directly or indirectly, the second housing 220. According to an embodiment, the first waterproofing member 431 may surround at least a portion of the camera module 401. The second waterproofing member 432 may surround at least a portion of the display driving circuit 402. The display driving circuit 402 may be disposed in the housing (e.g., the second housing 220) and control the operation of the display (e.g., the display 230 of FIG. 3).

According to an embodiment, at least a portion of the waterproofing member 430 may be formed in a closed loop shape. For example, the waterproofing member 430 may include a through hole 433 surrounding at least a portion of a component (e.g., the camera module 401 and/or the display driving circuit 402) of the electronic device 200.

According to an embodiment, the electronic device 200 may include an adhesive member 440 for connecting, directly or indirectly, the conductive plate 410 to the housing 202. According to an embodiment, the adhesive member 440 may be a double-sided tape.

According to an embodiment, the non-conductive member 420 and the adhesive member 440 may be disposed in different directions with respect to the conductive plate 410. For example, the adhesive member 440 may be disposed under the conductive plate 410 (e.g., −Z direction), and the non-conductive member 420 may be disposed on, directly or indirectly, a side surface (e.g., the Y-axis direction) of the conductive plate 410.

According to an embodiment, the display 300, the conductive plate 410, the non-conductive member 420, the waterproofing member 430, and/or the adhesive member 440 may be referred to as a display assembly.

According to an embodiment, at least one of the components of the display 300 may be attached to each other through adhesives 306a, 306b, and 306c. According to an embodiment, the adhesives 306a, 306b, and 306c may include at least one of a pressure sensitive adhesive (PSA), an optical clear adhesive (OCA), a thermally responsive adhesive, and/or a double-sided adhesive.

According to an embodiment, the protective film 301 may be connected to the window member 302 by the first adhesive 306a. According to an embodiment, the window member 302 may be connected to the display panel 303 by the second adhesive 306b. According to an embodiment, the digitizer 320 may be connected to the conductive plate 410 by the third adhesive 306c.

Figure 9:
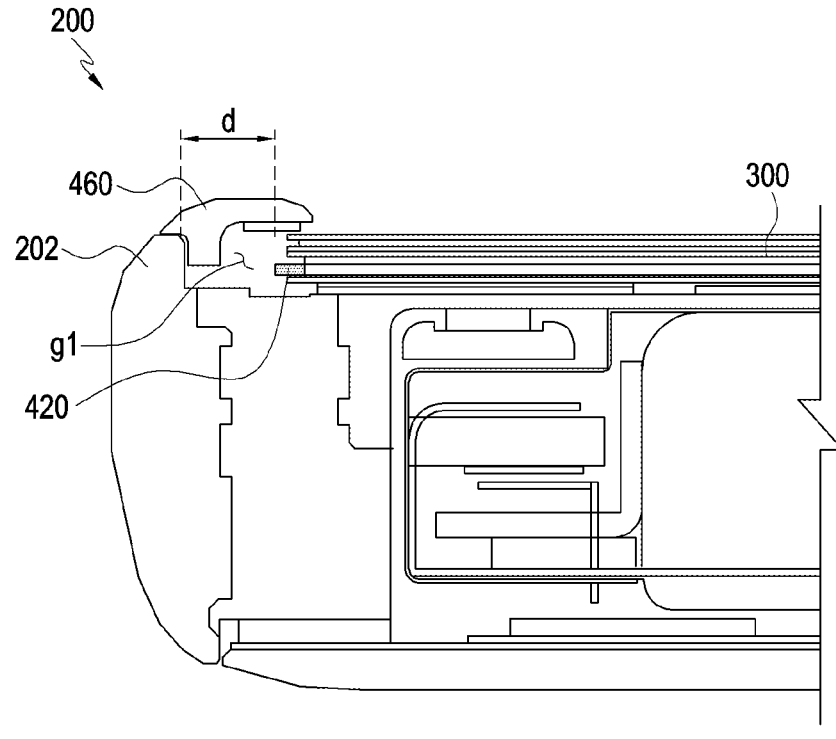
FIG. 9 is a cross-sectional view illustrating an electronic device according to an embodiment of the disclosure.

FIG. 9 is a cross-sectional view illustrating an electronic device according to an embodiment of the disclosure.

Referring to FIG. 9, the electronic device 200 may include a housing 202, a display 300, and a non-conductive member 420. The configuration of the housing 202, the display 300, and the non-conductive member 420 of FIG. 9 may be identical in whole or part to is the configuration of the housing 202 of FIG. 6 or the display 300 and the non-conductive member 420 of FIGS. 7 and/or 8.

According to an embodiment, at least a portion of the housing 202 may function as an antenna for radiating a wireless signal to the outside of the electronic device 200. For example, at least a portion of the housing 202 may include metal, and the metal portion of the housing 202 may be electrically connected to the communication module (e.g., the communication module 190 of FIG. 1, comprising communication circuitry).

According to an embodiment, the electronic device 200 may include a protection member 460. The configuration of the protection member 460 may be identical in whole or part to the configuration of the first protection member 214 and/or the second protection member 224 of FIG. 4. According to an embodiment, the protection member 460 may surround at least a portion of the display 300. For example, the protection member 460 may surround at least a portion of the space (e.g., the first space g1) between the housing 202 and the display 300. According to an embodiment, the protection member 460 may be connected to the housing 202 and cover at least a portion of an edge of the display 300.

According to an embodiment, the protection member 460 may be formed of a non-conductive material. For example, the protection member 460 may be formed of a resin material (e.g., plastic). According to an embodiment, the electrical conductivity of the protection member 460 may be lower than the electrical conductivity of the metal portion of the housing 202 or the electrical conductivity of the conductive plate (e.g., the conductive plate 410 of FIG. 7). According to an embodiment, the protection member 460 may be referred to as a deco member.

According to an embodiment, for folding and/or unfolding of the display 300, the display 300 and/or the non-conductive member 420 may be spaced apart from the housing 202. For example, the non-conductive member 420 may be spaced apart from the housing 202 by a predetermined distance d. According to an embodiment, the display 300 may be disposed to be spaced apart from the protection member 460 and/or the housing 202. For example, the electronic device 200 may include a first space g1 positioned between the display 300 and the protection member 460 and/or the housing 202. The first space g1 may be referred to as an empty space or a gap positioned between the display 300 and the protection member 460 or between the display 300 and the edge of the housing 202.

According to an embodiment, as the non-conductive member 420 and the housing 202 are spaced apart, a first space g1 surrounded by the display 300, the housing 202 and/or the protection member 460 may be formed. According to an embodiment, when moisture enters the first space g1, the housing 202 and the conductive plate (e.g., the conductive plate 410 of FIG. 7) may be electrically connected. For example, the housing 202 and the conductive plate 410 may be conducted through the moisture, changing the resonant frequency of the antenna. According to an embodiment, the housing 202 and the display 300 may be electrically connected.

According to an embodiment, the non-conductive member 420 may reduce the amount of moisture introduced into the first space g1. For example, as the non-conductive member 420 surrounds at least a portion of the display 300 or protrudes beyond the display 300 and/or the conductive plate (e.g., the conductive plate 410 of FIG. 7), the area of the first space g1 may be reduced. According to an embodiment, the non-conductive member 420 protrudes beyond the display 300, and interference between the conductive component (e.g., the metal portion of the housing 202) of the electronic device 200 and the digitizer (e.g., the digitizer 320 of FIG. 7) may be reduced. At least a portion of the non-conductive member 420 may be disposed between the digitizer 320 and the housing 202. According to an embodiment, the non-conductive member 420 may be disposed in the first space g1.

According to an embodiment, the protection member 460 may be excluded. Referring to FIG. 8, the non-conductive member 420 may surround at least a portion of the display 300, and the protection member 460 may be excluded.

Figure 10A:
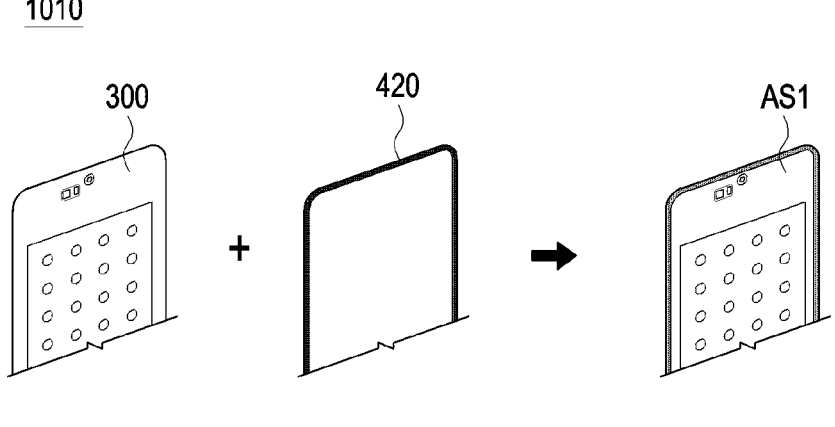
FIGS. 10A, 10B, and 10C are views illustrating assembly of an electronic device according to an embodiment of the disclosure.
Figure 10B:
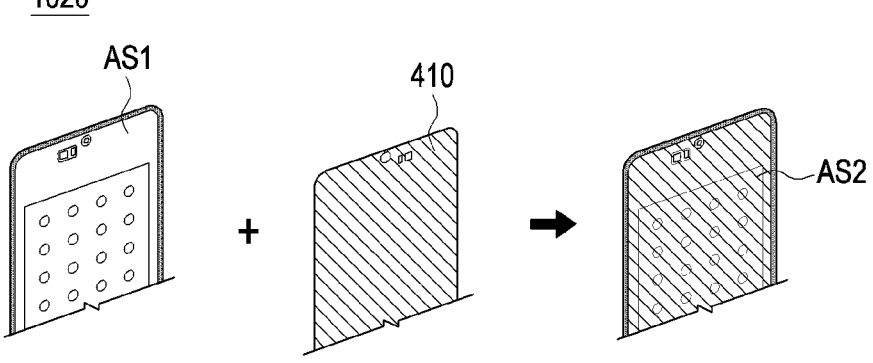
Figure 10C:
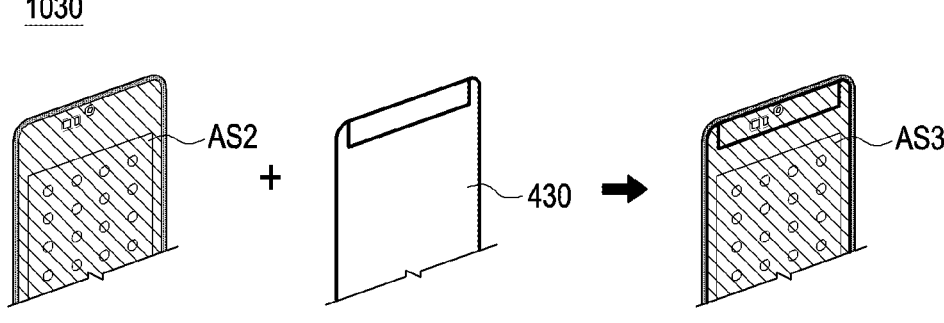
Figure 11:
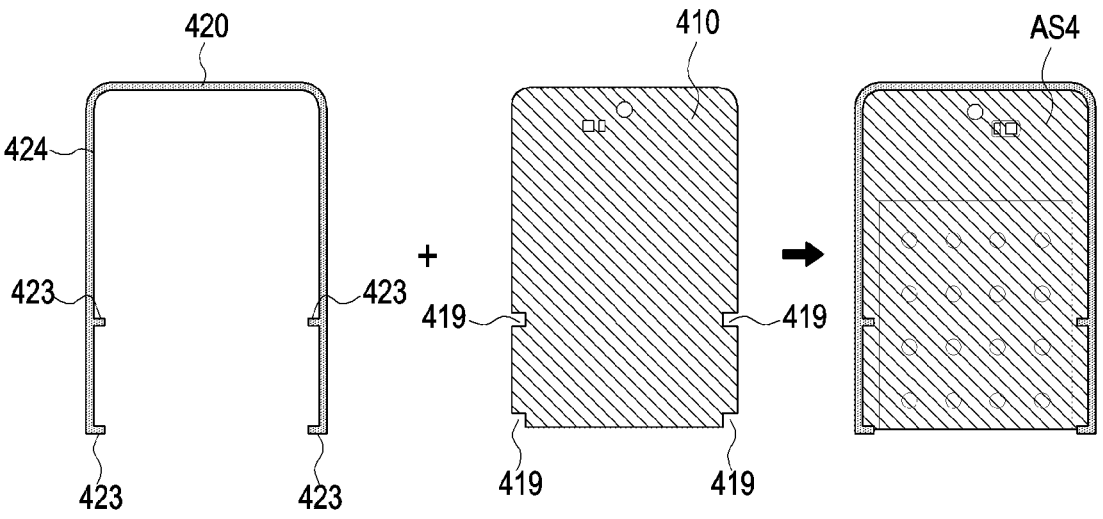
FIG. 11 is a view illustrating assembly of a conductive plate including a recess and a non-conductive member including a protrusion according to an embodiment of the disclosure.

FIGS. 10A to 10C are views illustrating assembly of an electronic device according to an embodiment of the disclosure. FIG. 11 is a view illustrating assembly of a conductive plate including a recess and a non-conductive member including a protrusion according to an embodiment of the disclosure.

The configuration of the display 300, the conductive plate 410, the non-conductive member 420 and the waterproofing member 430 of FIG. 10A, 10B, 10C and/or 11 may be identical in whole or part to the configuration of the display 300, the conductive plate 410, the non-conductive member 420, and the waterproofing member 430 of FIGS. 7 and/or 8.

Referring to FIG. 10A, the process for manufacturing the electronic device (e.g., the electronic device 200 of FIG. 2) may include a first process 1010 of manufacturing a first assembly AS1 by combining the display 300 and the non-conductive member 420. For example, the first process 1010 may include a process of connecting the non-conductive member 420 to the edge portion of the display 300. The first assembly AS1 may be referred to as a display 300 and a non-conductive member 420 connected to the display 300.

Referring to FIG. 10B, the process for manufacturing the electronic device (e.g., the electronic device 200 of FIG. 2) may include a second process 1020 of manufacturing a second assembly AS2 by combining the conductive plate 410 to the first assembly AS1. For example, the second process 1020 may include a process of connecting, directly or indirectly, the conductive plate 410 to the display 300. The conductive plate 410 may be surrounded by the non-conductive member 420. For example, the conductive plate 410 may be disposed on the inner area of the display 300. The second assembly AS2 may be referred to as a display 300, a conductive plate 410, and a non-conductive member 420.

Referring to FIG. 10C, the process for manufacturing the electronic device (e.g., the electronic device 200 of FIG. 2) may include a third process 1030 of manufacturing a third assembly AS3 by combining the waterproofing member 430 to the second assembly AS2. For example, the third process 1030 may include a process of connecting, directly or indirectly, the waterproofing member 430 to the conductive plate 410 and/or the non-conductive member 420. The third assembly AS3 may be referred to as a display 300, a conductive plate 410, a non-conductive member 420, and a waterproofing member 430.

Referring to FIG. 11, the conductive plate 410 and/or the non-conductive member 420 may be formed in a structure to increase the waterproof function and/or water resistant function of the electronic device (e.g., the electronic device 200 of FIG. 7). According to an embodiment, the conductive plate 410 and/or the non-conductive member 420 may be formed in an assembly structure AS4 for adjusting the shape of the empty space between the display 300 and the housing (e.g., the housing 202 of FIG. 9). For example, the non-conductive member 420 may include an edge portion 424 and a protruding portion 423 extending from the edge portion 424. The conductive plate 410 may include at least one recess 419 for receiving at least a portion of the protruding portion 423. According to an embodiment, the length of the path connected to the electronic component of the electronic device (e.g., the electronic device 200 of FIG. 2) is extended by the recess 419 and the protruding portion 423, thereby increasing the waterproof function.

Figure 12:
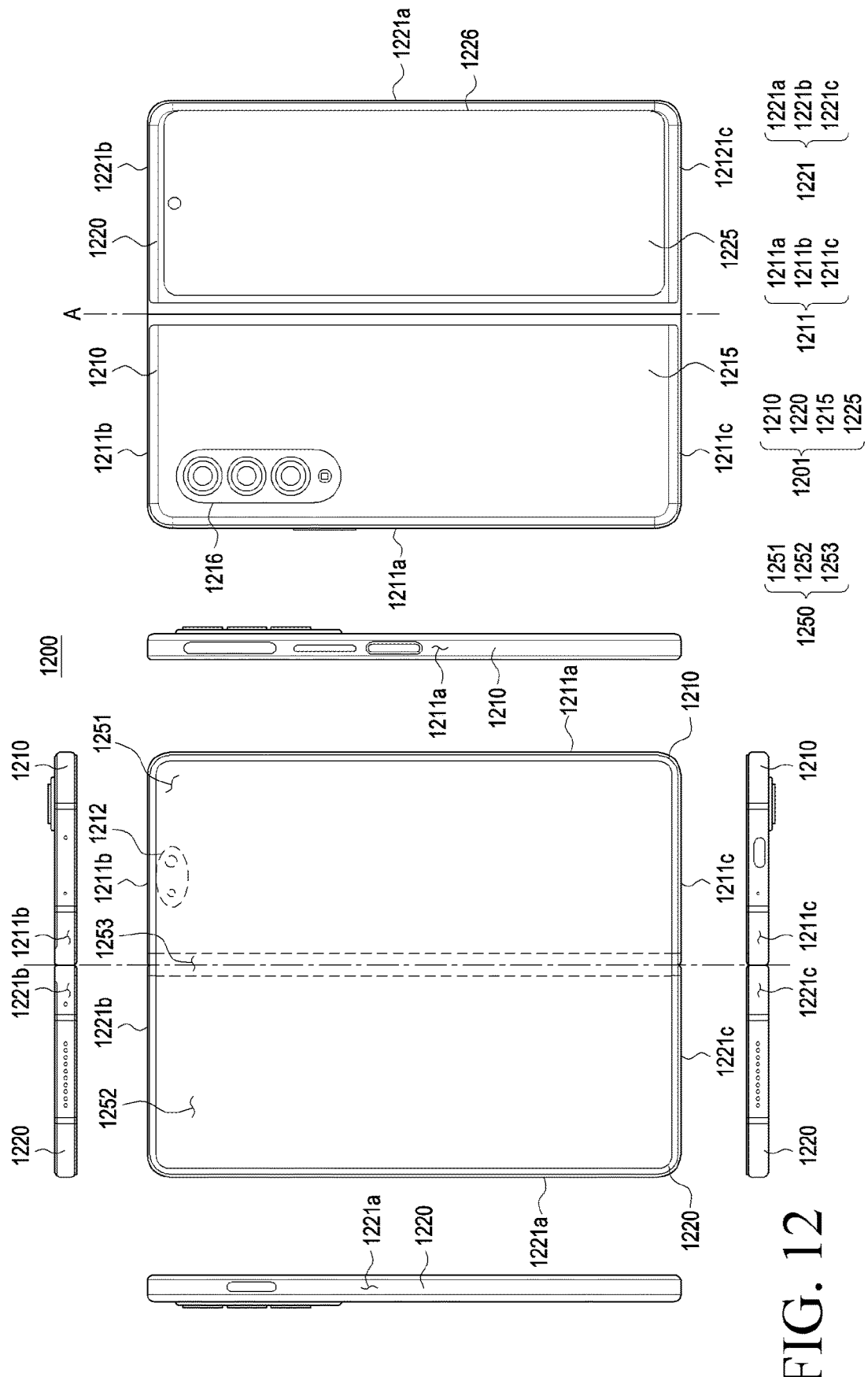
FIG. 12 is a view illustrating an unfolded state of a foldable electronic device according to an embodiment of the disclosure.
Figure 13:
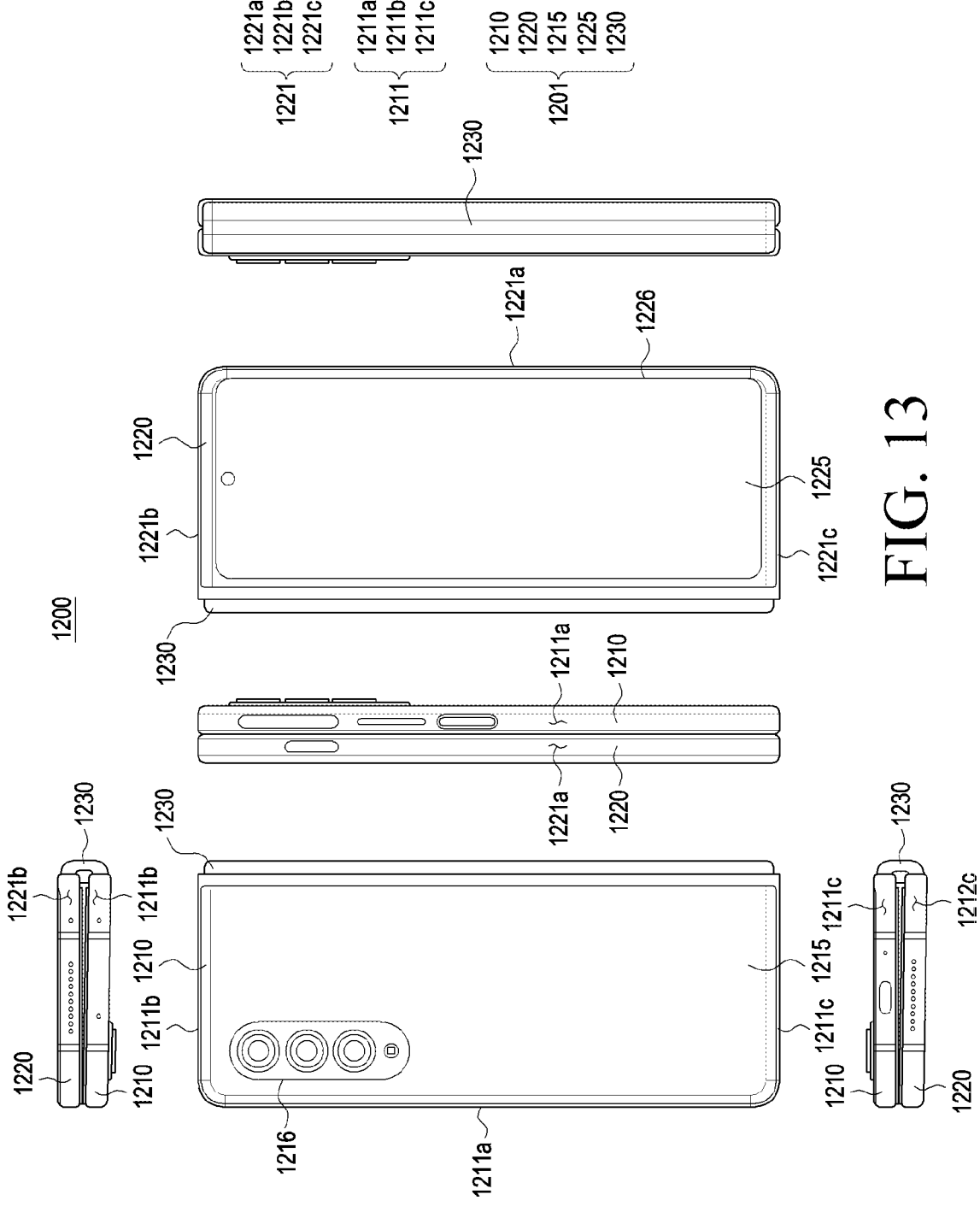
FIG. 13 is a view illustrating a folded state of a foldable electronic device according to an embodiment of the disclosure.

FIG. 12 is a view illustrating an unfolded state of a foldable electronic device according to an embodiment of the disclosure. FIG. 13 is a view illustrating a folded state of a foldable electronic device according to an embodiment of the disclosure.

FIG. 12 is a view illustrating an unfolded status among folding statuses of a foldable electronic device according to an embodiment of the disclosure. FIG. 13 is a view illustrating a folded status among folding statuses of a foldable electronic device according to an embodiment of the disclosure. According to an embodiment, the configuration of the electronic device 1200 of FIGS. 12 and/or 13 may be identical in whole or part to the configuration of the electronic device 200 of FIGS. 2 and/or 3.

Referring to FIGS. 12 and 13, the electronic device 1200 may be folded about the folding axis A extending parallel to the length direction (e.g., the Y-axis direction) of the electronic device 1200. Referring to FIGS. 12 and 13, according to an embodiment, an electronic device 1200 may include a foldable housing 1201 and a flexible or foldable display 1250 (hereinafter, simply "flexible display 1250") (e.g., the display device 160 of FIG. 1) disposed in a space formed by the foldable housing 1201. According to an embodiment, the surface where the flexible display 1250 is disposed (or the surface where the flexible display 1250 is viewed from the outside of the electronic device 1200) may be the front surface of the electronic device 1200. The opposite surface of the front surface may be a rear surface of the electronic device 1200. The surface surrounding the space between the front and rear surfaces may be a side surface of the electronic device 1200.

According to an embodiment, the foldable housing 1201 may include a first housing 1210 including a sensor area 1212, a second housing 1220, a first rear cover 1215, a second rear cover 1225, and a hinge assembly 1230. Here, the hinge assembly 1230 may include a hinge cover (e.g., the hinge cover 1232 of FIG. 14) that covers the foldable portion of the foldable housing 1201. The foldable housing 1201 of the electronic device 1200 are not limited to the shape and coupling shown in FIGS. 12 and 13 but may rather be implemented in other shapes or via a combination and/or coupling of other components. For example, in an embodiment, the first housing 1210 and the first rear cover 1215 may be integrally formed with each other, and the second housing 1220 and the second rear cover 1225 may be integrally formed with each other.

According to an embodiment, an illuminance sensor and an image sensor (not shown) may be disposed in the sensor area 1212. The illuminance sensor may detect the amount of light around the electronic device 1200. The image sensor may convert the light incident through the camera lens into a digital signal. The illuminance sensor and the image sensor may be visually exposed to the flexible display 1250. According to an embodiment, the illuminance sensor and the image sensor may not be visually exposed. For example, the camera may be configured as an under display camera (UDC). Pixels in one area of the flexible display 1250 corresponding to the location of the UDC may be configured to differ from pixels in other areas, so that the image sensor and/or camera may not be visually exposed.

According to an embodiment, the first housing 1210 may be connected to the hinge assembly 1230 and may include a first front surface facing in a first direction and a first rear surface facing in a direction opposite to the first direction. The second housing 1220 may be connected to the hinge assembly 1230 and may include a second front surface facing in a second direction and a second rear surface facing in a direction opposite to the second direction. The second housing 1220 may rotate on the hinge assembly 1230 from the first housing 1210. The electronic device 1200 may transform to a folded status or an unfolded status.

According to an embodiment, housing 1210, 1220 may include a plurality of side surface 1211, 1221. The first housing 1210 may include a first side surface 1211*a* disposed to be spaced apart from and in parallel to the folding axis A of the hinge assembly 1230 between the first front surface and the first rear surface, and the second housing 1220 may include a second side surface 1221*a* disposed to be spaced apart from and in parallel to the folding axis A of the hinge assembly 1230 between the second front surface and the second rear surface. Further, the first housing 1210 may include a third side surface 1211*b* perpendicular to the first side surface 1211*a* and having an end connected with the first side surface 1211*a* and another end connected with the hinge assembly 1230 and a fourth side surface 1211*c* perpendicular to the first side surface 1211*a* and having an end connected with the first side surface 1211*a* and another end connected with the hinge assembly 1230 and spaced apart from and in parallel to the third side surface 1211*b*. The second housing 1220 may include a fifth side surface 1221*b* perpendicular to the second side surface 1221*a* and having an end connected with the second side surface 1221*a* and another end connected with the hinge assembly 1230 and a sixth side surface 1221*c* perpendicular to the second side surface 1221*a* and having an end connected with the second side surface 1221*a* and another end connected with the hinge assembly 1230 and spaced apart from and in parallel to the fifth side surface 1221*b*. When the second housing 1220 is folded to the first housing 1210 on the hinge assembly 1230, the first side surface 1211*a* may approach the second side surface 1221*a* and, when the second housing 1220 is unfolded from the first housing 1210 on the hinge assembly 1230, the first side surface 1211*a* may move away from the second side surface 1221*a*.

According to an embodiment, in the fully folded state of the electronic device 1200, the first front surface may face the second front surface and, in the fully unfolded state, the second direction may be identical to the first direction. In the fully unfolded state, the distance between the first side surface 1211*a* and the second side surface 1221*a* may be the largest.

According to an embodiment, the first housing 1210 and the second housing 1220 are disposed on both sides of the folding axis A and be overall symmetrical in shape with respect to the folding axis A. As described below, the angle or distance between the first housing 1210 and the second housing 1220 may be varied depending on whether the electronic device 1200 is in the unfolded state, the folded state, or the partially unfolded (or partially folded) intermediate state.

According to an embodiment, as shown in FIG. 12, the first housing 1210 and the second housing 1220 together may form a recess to receive the flexible display 1250. According to an embodiment, the first housing 1210 and the second housing 1220 may at least partially be formed of a metal or non-metallic material with a rigidity selected to support the flexible display 1250. At least a portion formed of metal may provide a ground plane of the electronic device 1200 and may be electrically connected with a ground line formed on the printed circuit board disposed in the foldable housing 1201.

According to an embodiment, a protection member (not shown) may be disposed outside the flexible display 1250. The protection member may be formed integrally with the side surface of the foldable housing 1201 or as a separate structure. The flexible display 1250 may not adhere to the side surface of the foldable housing 1201 and/or the protection member. A gap may be formed between the flexible display 1250 and the protection member. The protection member may be configured to cover the internal configuration of the electronic device 1200 from the outside or to protect the internal configuration of the electronic device 1200 from external impact. According to an embodiment, the protection member may be configured to cover the line mounted on the flexible display 1250 from the outside or to protect it from an external impact.

According to an embodiment, the first rear cover 1215 may be disposed on one side of the folding axis A on the rear surface of the electronic device 1200 and have, e.g., a substantially rectangular periphery which may be surrounded by the first housing 1210. Similarly, the second rear cover 1225 may be disposed on the opposite side of the folding axis A on the rear surface of the electronic device 1200 and its periphery may be surrounded by the second housing 1220.

According to an embodiment, the first rear cover 1215 and the second rear cover 1225 may be substantially symmetrical in shape with respect to the folding axis A. However, the first rear cover 1215 and the second rear cover 1225 are not necessarily symmetrical in shape. In an embodiment, the electronic device 1200 may include the first rear cover 1215 and the second rear cover 1225 in various shapes. In an embodiment, the first rear cover 1215 may be integrally formed with the first housing 1210, and the second rear cover 1225 may be integrally formed with the second housing 1220.

According to an embodiment, the first rear cover 1215, the second rear cover 1225, the first housing 1210, and the second housing 1220 may form a space where various components (e.g., a printed circuit board or battery) of the electronic device 1200 may be disposed. According to an embodiment, one or more components may be arranged or visually exposed on/through the rear surface of the electronic device 1200. For example, one or more components or sensors may be visually exposed through a first rear surface area 1216 of the first rear cover 1215. According to an embodiment, the sensor may include a proximity sensor and/or a rear-facing camera. According to an embodiment, a sub display may be at least visually exposed through a second rear surface area 1226 of the second rear cover 1225.

According to an embodiment, the front camera disposed on the front surface (e.g., the second front surface) of the electronic device 1200 or the rear camera exposed through the first rear area 1216 of the first rear cover 1215 may include one or more lenses, an image sensor, and/or an image signal processor. The flash may include, e.g., a light emitting diode (LED) or a xenon lamp. According to an embodiment, two or more lenses (an infrared (IR) camera, a wide-angle lens, and a telephoto lens) and image sensors may be disposed on one surface of the electronic device 1200. Each "processor" herein comprises processing circuitry.

Referring to FIG. 13, the hinge cover (e.g., the hinge cover 1232 of FIG. 14) included in the hinge assembly 1230 may be disposed between the first housing 1210 and the second housing 1220 to hide the internal components (e.g., the hinge assembly 1230). According to an embodiment, the hinge assembly 1230 may be hidden by a portion of the first housing 1210 and second housing 1220 or be exposed to the outside depending on the state (the unfolded state, intermediate state, or folded state) of the electronic device 1200.

According to an embodiment, as shown in FIG. 12, in the unfolded state (e.g., a fully unfolded state) of the electronic device 1200, the hinge assembly 1230 may be hidden not to be exposed by the first housing 1210 and the second housing 1220. As another example, as shown in FIG. 13, in the folded state (e.g., a fully folded state) of the electronic device 1200, the hinge assembly 1230 may be exposed to the outside between the first housing 1210 and the second housing 1220. As another example, in an intermediate state in which the first housing 1210 and the second housing 1220 are folded with a certain angle, the hinge assembly 1230 may be partially exposed to the outside between the first housing 1210 and the second housing 1220. In this case, however, the exposed area may be smaller than in the fully folded state. According to an embodiment, the hinge assembly 1230 may include a curved surface.

According to an embodiment, the flexible display 1250 may be disposed in a space formed by the foldable housing 1201. For example, the flexible display 1250 may be seated in a recess formed by the foldable housing 1201 and may be seen from the outside through the front surface (e.g., the first front surface and/or the second front surface) of the electronic device 1200. According to an embodiment, the flexible display 1250 may constitute most of the front surface (e.g., the first front surface and/or the second front surface) of the electronic device 1200. Thus, the front surface (e.g., the first front surface and/or second front surface) of the electronic device 1200 may include the flexible display 1250 and a partial area of the first housing 1210 and a partial area of the second housing 1220, which are adjacent to the flexible display 1250. The rear surface (e.g., the first rear surface and/or second rear surface) of the electronic device 1200 may include the first rear cover 1215, a partial area of the first housing 1210 adjacent to the first rear cover 1215, the second rear cover 1225, and a partial area of the second housing 1220 adjacent to the second rear cover 1225.

According to an embodiment, the flexible display 1250 may include a display at least a portion of which may be transformed into a flat or curved surface. According to an embodiment, the flexible display 1250 may include a folding area 1253, a first area 1251 disposed on one side of the folding area 1253 (e.g., the right side of the folding area 1253 of FIG. 12), and a second area 1252 disposed on the opposite side of the folding area 1253 (e.g., the left side of the folding area 1253 of FIG. 12).

However, the segmentation of the flexible display 1250 as shown in FIG. 12 is merely an example, and the display 1250 may be divided into a plurality of (e.g., four or more, or two) areas depending on the structure or function of the display. For example, in the embodiment illustrated in FIG.

12, the area of the flexible display 1250 may be divided by the folding area 1253 extending parallel to the folding axis A, but in an embodiment, the area of the flexible display 1250 may be divided by another folding axis (e.g., a folding axis parallel to the width direction of the electronic device).

According to an embodiment of the disclosure, the flexible display 1250 may be coupled with or disposed adjacent, directly or indirectly, to a touch panel equipped with a touch detection circuit or a pressure sensor capable of measuring the strength (pressure) of a touch. For example, the flexible display 1250 may be disposed adjacent, directly or indirectly, to or coupled with a touch panel, as an example of the touch pane, which detects a stylus pen of an electromagnetic resonance (EMR) type.

According to an embodiment, the first area 1251 and the second area 1252 may be overall symmetrical in shape with respect to the folding area 1253.

Described below are the operation of the first housing 1210 and the second housing 1220 and each area of the flexible display 1250 depending on the state (e.g., the folded state, unfolded state, or intermediate state) of the electronic device 1200.

According to an embodiment, when the electronic device 1200 is in the unfolded state (e.g., FIG. 12), the first housing 1210 and the second housing 1220 may be disposed to face in the same direction while being angled at 180 degrees therebetween. The surface of the first area 1251 and the surface of the second area 1252 of the flexible display 1250 may be angled at 180 degrees therebetween while facing in the same direction (e.g., forward of the front surface of the electronic device). In this case, the folding area 1253 may be coplanar with the first area 1251 and the second area 1252.

According to an embodiment, when the electronic device 1200 is in the folded state (e.g., FIG. 13), the first housing 1210 and the second housing 1220 may be disposed to face each other. The surface of the first area 1251 and the surface of the second area 1252 of the flexible display 1250 may be angled at a small angle (e.g., ranging from 0 degrees to 10 degrees) therebetween while facing each other. At least a portion of the folding area 1253 may have a curved surface with a predetermined curvature.

According to an embodiment, when the electronic device 1200 is in the intermediate state, the first housing 1210 and the second housing 1220 may be disposed at a certain angle therebetween. The surface of the first area 1251 of the flexible display 1250 and the surface of the second area 1252 may form an angle which is larger than the angle in the folded state and smaller than the angle in the unfolded state. The folding area 1253 may at least partially have a curved surface with a predetermined curvature and, in this case, the curvature may be smaller than that when it is in the folded state.

Figure 14:
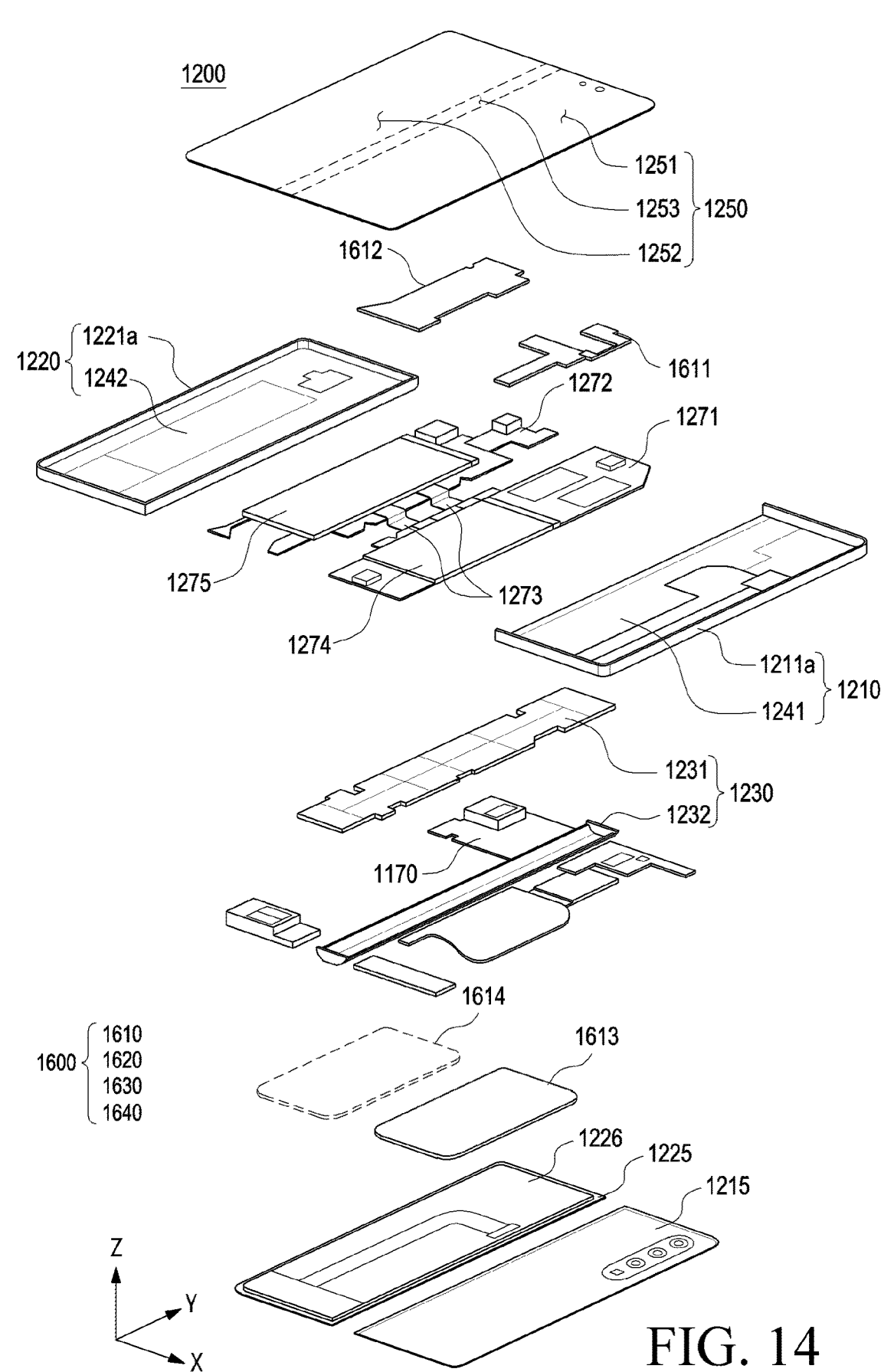
FIG. 14 is an exploded perspective view illustrating a foldable electronic device according to an embodiment of the disclosure.

FIG. 14 is an exploded perspective view illustrating a foldable electronic device according to an embodiment of the disclosure.

FIG. 14 illustrates a spatial coordinate system defined by an X-axis, a Y-axis and a Z-axis orthogonal to each other. Here, the X axis may indicate a width direction of the electronic device, the Y axis may indicate a length direction of the electronic device, and the Z axis may indicate a height (or thickness) direction of the electronic device. In describing an embodiment of the disclosure, the 'first direction and the second direction' may mean directions parallel to the Z-axis.

The foldable housing 1201, the first housing 1210, the second housing 1220, the hinge assembly 1230, and the flexible display 1250 disclosed in FIG. 14 may be identical or similar to the foldable housing 1201, the first housing 1210, the second housing 1220, the hinge assembly 1230, and the flexible display 1250 disclosed in FIGS. 12 and 13. Accordingly, no description is given of the same components.

According to an embodiment of the disclosure, the electronic device 1200 may include various electronic components disposed inside or outside the first housing 1210 and the second housing 1220. The various electronic components may include, e.g., a processor (e.g., the processor 120 of FIG. 1), a memory (e.g., the memory 130 of FIG. 1), an input module (e.g., the input module 150 of FIG. 1), a sound output module (e.g., sound output module 155 of FIG. 1), a display 1250 (e.g., the display module 160 of FIG. 1), an audio module 1170, a sensor (e.g., the sensor module 176 of FIG. 1), an interface (e.g., the interface 177 of FIG. 1), a connecting terminal (e.g., the connecting terminal 178 of FIG. 1), a haptic module (e.g., the haptic module 179 of FIG. 1), a camera module (e.g., the camera module 180 of FIG. 1), a power management module 188, batteries 1274 and 1275 (e.g., the battery 189 of FIG. 1), a communication module (e.g., the communication module 190 of FIG. 1), a subscriber identification module (e.g., the subscriber identification module 196 of FIG. 1), or an antenna module (e.g., the antenna module 197 of FIG. 1). The electronic components may be appropriately separated and disposed in the inner or outer space of the first housing 1210 and the second housing 1220. At least one (e.g., the connecting terminal 178) of the components may be omitted from the electronic device 1200, or one or more other components may be added in the electronic device 101. Further, some of these components may be integrated into one component. The configuration of the audio module 1170 may be identical in whole or part to the configuration of the audio module 170 of FIG. 1.

According to an embodiment, the electronic device 1200 is a foldable electronic device, and may include a plurality of batteries to supply and store power required for driving to electronic components. For example, the electronic device 1200 may include a first battery 1274 and a second battery 1275 disposed in the first housing 1210 and the second housing 1220, respectively.

According to an embodiment, the electronic device 1200 is a foldable electronic device, and may include a first plate 1241 and/or a second plate 1242 for disposing components in the first housing 1210 and the second housing 1220. Various electronic components and/or circuit boards 1271 and 1272 may be disposed on the first plate 1241 and/or the second plate 1242. According to an embodiment, the first plate 1241 and the first circuit board 1271 may be disposed in the first housing 1210, and the second plate 1242 and the second circuit board 1272 may be disposed in the second housing 1220. The first plate 1241 may include a first surface facing in the first direction. The second plate 1242 may include a second surface facing in the second direction. The first plate 1241 and the second plate 1242 may be folded or unfolded with respect to each other by the hinge plate 1231 formed corresponding to the folding area 1253 of the flexible display 1250 and be formed to face each other in the folded state and, in the unfolded state, be formed so that the first surface and the second surface face in the same direction.

According to an embodiment, the first circuit board 1271 may be disposed under the first plate 1241 (1-Z-axis direction), and the second circuit board 1272 may be disposed under the second plate 1242 (1-Z-axis direction).

According to an embodiment, signals of the processor for implementing various functions and operations of the electronic device 1200 may be transferred through various conductive lines 1273 and/or connecting member (connector) (not shown) formed on the printed circuit boards 1271 and 1272.

Referring to FIG. 14, according to an embodiment, the electronic device 1200 may include a flexible display 1250, a foldable housing, a hinge assembly 1230, a first circuit board 1271, a second circuit board 1272, and a member 1600.

According to an embodiment, the foldable housing 1201 may include a first housing 1210, a second housing 1220, a first rear cover 1215, a second rear cover 1225, and a hinge assembly 1230.

According to an embodiment, the flexible display 1250 may include a display panel (not shown). In an embodiment, the first plate 1241 and the second plate 1242 may be disposed between the display panel and the first circuit board 1271 and the second circuit board 1272. The hinge assembly 1230 may be disposed between the first plate 1241 and the second plate 1242.

According to an embodiment, the hinge assembly 1230 may include a hinge member 1231 and a hinge cover 1232. The hinge cover 1232 may cover a structure disposed inside the hinge assembly 1230.

According to an embodiment, a first circuit board 1271 and a second circuit board 1272 may be included. The first circuit board 1271 and the second circuit board 1272 may be disposed in a space formed by the first plate 1241, the second plate 1242, the first housing 1210, the second housing 1220, the first rear cover 1215, and the second rear cover 1225. Components for implementing various functions of the electronic device 1200 may be disposed on the first circuit board 1271 and the second circuit board 1272.

According to an embodiment, the first housing 1210 and the second housing 1220 may be assembled together to be coupled to two opposite sides of the hinge assembly 1230, with the first plate 1241 and the second plate 1242 coupled with the flexible display 1250. For example, the first housing 1210 may slide and couple from one side of the hinge assembly 1230, and the second housing 1220 may slide and couple from another side of the hinge assembly 1230.

According to an embodiment, the member 1600 may be disposed in the electronic device 1200. According to an embodiment, the member 1600 may be disposed between the first housing 1210 and/or the first plate 1241 and the flexible display 1250. According to an embodiment, the member 1600 may be disposed between the second housing 1220 and/or the second plate 1242 and the flexible display 1250. According to an embodiment, the member 1600 may be disposed between the first circuit board 1271 and/or the first housing 1210 and the first rear cover 1215 and may be disposed between the second circuit board 1272 and/or the second housing 1220 and the second rear cover 1225. According to an embodiment, the member 1600 may include a waterproofing member 1610, an adhesive member 1620, a supporting member 1630, and a cushion member 1640.

According to an embodiment, the waterproofing member 1610 may include a first waterproofing member 1611, a second waterproofing member 1612, a third waterproofing member 1613, and a fourth waterproofing member 1614.

According to an embodiment, the first waterproofing member 1611 may be disposed between the first plate 1241 of the first housing 1210 and the first area 1251 of the flexible display 1250. According to an embodiment, the first waterproofing member 1611 may be composed of a waterproofing tape. The first waterproofing member 1611 may be adhered to the first housing and/or the first plate 1241 and may be adhered to the flexible display 1250. The first waterproofing member 1611 may be configured as a closed loop. The first waterproofing member 1611 configured as a closed loop may include at least one area. As the first waterproofing member 1611 is composed of a waterproofing tape and includes at least one area composed of a closed loop, it is possible to prevent or reduce liquid introduction from the outside of the closed loop to the inside of the closed loop of the first waterproofing member 1611.

According to an embodiment, the second waterproofing member 1612 may be disposed between the second plate 1242 of the second housing 1220 and the second area 1252 of the flexible display 1250. According to an embodiment, the second waterproofing member 1612 may be composed of a waterproofing tape. The second waterproofing member 1612 may be adhered to the second housing 1220 and/or the second plate 1242 and may be adhered to the flexible display 1250. The second waterproofing member 1612 may be configured as a closed loop. The second waterproofing member 1612 configured as a closed loop may include at least one area. As the second waterproofing member 1612 is composed of a waterproofing tape and includes at least one area composed of a closed loop, it is possible to prevent or reduce liquid introduction from the outside of the closed loop to the inside of the closed loop of the second waterproofing member 1612.

According to an embodiment, the first waterproofing member 1611 and the second waterproofing member 1612 may be disposed so as not to contact the hinge assembly 1230.

According to an embodiment, the third waterproofing member 1613 may be disposed between the first housing 1210 and the first rear cover 1215. According to an embodiment, the third waterproofing member 1613 may be composed of a waterproofing tape. The third waterproofing member 1613 may be adhered to the first housing 1210 and may be adhered to the first rear cover 1215. The third waterproofing member 1613 may be configured as a closed loop. The third waterproofing member 1613 configured as a closed loop may include at least one area. As the third waterproofing member 1613 is composed of a waterproofing tape and includes at least one area composed of a closed loop, it is possible to prevent or reduce liquid introduction from the outside of the closed loop to the inside of the closed loop of the third waterproofing member 1613.

According to an embodiment, the fourth waterproofing member 1614 may be disposed between the second housing 1220 and the second rear cover 1225. According to an embodiment, the fourth waterproofing member 1614 may be composed of a glue and/or a waterproofing tape. Waterproofing material may be, for example and without limitation, polymer inclusive, fabric inclusive, and/or metal inclusive, in certain example embodiments. The fourth waterproofing member 1614 may be adhered to the second housing 1220 and may be adhered to at least a portion of the second rear cover 1225. The fourth waterproofing member 1614 may be configured as a closed loop. The fourth waterproofing member 1614 configured as a closed loop may include at least one area. As the fourth waterproofing member 1614 is composed of a glue and includes at least one area composed of a closed loop, it is possible to prevent or reduce liquid introduction from the outside of the closed loop to the inside of the closed loop of the fourth waterproofing member 1614.

As such, as the waterproofing member 1610 is disposed in the electronic device 1200, it is possible to prevent or reduce liquid from being introduced into the electronic device 1200 from the outside of the electronic device 1200.

An electronic device (e.g., a portable terminal) includes a display with a flat surface or both a flat and curved surface. An electronic device including a display may have a limitation in realizing a screen larger than the size of the electronic device due to the fixed display structure. Accordingly, research has been conducted on electronic devices including a foldable or rollable display. However, a foldable electronic device requires an empty space between the display and the housing to fold the display. Moisture may enter the empty space.

The foldable electronic device may include a plate to support and protect the display. To have rigidity for supporting the display, the plate may be formed of a conductive material. However, when moisture is introduced into the empty space, the conductive plate may be electrically connected, directly or indirectly, to the housing through moisture, changing the resonant frequency.

According to an embodiment of the disclosure, there may be provided an electronic device including a non-conductive member, capable of protecting the display and reducing degradation of antenna performance.

The disclosure is not limited to the foregoing embodiments but various modifications or changes may rather be made thereto without departing from the spirit and scope of the disclosure.

According to an embodiment of the disclosure, the electronic device may include a non-conductive member protruding toward a side surface of the housing rather than the support sheet of the display or the conductive plate. Due to the non-conductive member, moisture ingress into the space between the display and the housing of the electronic device may be reduced, and degradation of antenna performance may be prevented or reduced. Further, the non-conductive member may protect the display from external impact.

Other various effects may be provided directly or indirectly in the disclosure.

According to an embodiment of the disclosure, an electronic device (e.g., the electronic device 200 of FIG. 2) may comprise a housing (e.g., the housing 202 of FIG. 2) including a first housing (e.g., the first housing 210 of FIG. 2) and a second housing (e.g., the second housing 220 of FIG. 2), a display (e.g., the display 230 of FIG. 2) disposed on the first housing and the second housing, a hinge structure (e.g., the hinge structure 280 of FIG. 4) connecting, directly or indirectly, the first housing and the second housing, a conductive plate (e.g., the conductive plate 410 of FIG. 7) supporting the display, a non-conductive member (e.g., the non-conductive member 420 of FIG. 7) surrounding at least a portion of the conductive plate and protruding with respect to the display, and a waterproofing member (e.g., the waterproofing member 430 of FIG. 7) at least partially disposed between the non-conductive member and the housing.

According to an embodiment, the non-conductive member may include a first portion (e.g., the first portion 421 of FIG. 7) supporting the display and a second portion (e.g., the second portion 422 of FIG. 7) extending from the first portion.

According to an embodiment, the non-conductive member may surround at least a portion of a side surface (e.g., the side surface 300a of FIG. 8) of the display.

According to an embodiment, the waterproofing member may have a closed loop shape.

According to an embodiment, the waterproofing member may be attached, directly or indirectly, to the conductive plate and the non-conductive member.

According to an embodiment, the electronic device may further comprise a camera module (e.g., the camera module 401 of FIG. 5) disposed in the housing. The waterproofing member may include a first waterproofing member (e.g., the first waterproofing member 431 of FIG. 5) surrounding at least a portion of the camera module.

According to an embodiment, the electronic device may further comprise a display driving circuit disposed in the housing and configured to control an operation of the display. The waterproofing member may include a second waterproofing member (e.g., the second waterproofing member 432 of FIG. 5) surrounding at least a portion of the display driving circuit.

According to an embodiment, the electronic device may further comprise a digitizer (e.g., the digitizer 320 of FIG. 8) disposed on the conductive plate.

According to an embodiment, the electronic device may further comprise an adhesive member (e.g., the adhesive member 440 of FIG. 7) connecting, directly or indirectly, the conductive plate and the housing.

According to an embodiment, the non-conductive member may be disposed on a side surface of the conductive plate. The adhesive member may be disposed under, directly or indirectly, the conductive plate.

According to an embodiment, the conductive plate may include at least one recess (e.g., the recess 419 of FIG. 11). The non-conductive member may include a protruding portion (e.g., the protruding portion 423 of FIG. 11) received in the at least one recess.

According to an embodiment, the display may include a first display area (e.g., the first display area 231 of FIG. 2) disposed on the first housing, a second display area (e.g., the second display area 232 of FIG. 2) disposed on the second housing, and a folding area (e.g., the folding area 233 of FIG. 2) positioned between the first display area and the second display area and at least partially facing the hinge structure.

According to an embodiment, the electronic device may further comprise a support sheet (e.g., the support sheet 310 of FIG. 7) supporting the display and including a plurality of openings (e.g., the opening 313 of FIG. 7) facing at least a portion of the folding area.

According to an embodiment, the non-conductive member may be disposed further adjacent to the side surface (e.g., the first side surface 210c and/or the second side surface 220c of FIG. 2) of the housing than the support sheet or the conductive plate.

According to an embodiment, the electronic device may further comprise a protection member (e.g., the protection member 460 of FIG. 9) surrounding at least a portion of the display.

According to an embodiment, the display may include a protection film (e.g., the protection film 301 of FIG. 7) for protecting an outer surface of the display, a window member (e.g., the window member 302 of FIG. 7) supporting the protection film, and a display panel (e.g., the display panel 303 of FIG. 7) disposed under the window member.

According to an embodiment, an electronic device (e.g., the electronic device 200 of FIG. 2) may comprise a housing (e.g., the housing 202 of FIG. 2) including a first housing (e.g., the first housing 210 of FIG. 2) and a second housing (e.g., the second housing 220 of FIG. 2), a display (e.g., the display 230 of FIG. 2) including a first display area (e.g., the first display area 231 of FIG. 2) disposed on the first housing, a second display area (e.g., the second display area 232 of FIG. 2) disposed on the second housing, and a folding area (e.g., the folding area 233 of FIG. 2) positioned between the first display area and the second display area, a support sheet (e.g., the support sheet 310 of FIG. 7) supporting the display and including at least one opening (e.g., the opening 313 of FIG. 7) facing the folding area, a digitizer (e.g., the digitizer 320 of FIG. 7) disposed under, directly or indirectly, the support sheet, a conductive plate (e.g., the conductive plate 410 of FIG. 7) disposed under the digitizer, a non-conductive member (e.g., the non-conductive member 420 of FIG. 7) surrounding at least a portion of the conductive plate, and a waterproofing member (e.g., the waterproofing member 430 of FIG. 7) at least partially disposed between the non-conductive member and the housing. The non-conductive member may be disposed further adjacent to a side surface (e.g., the first side surface 210*c* and/or second side surface 220*c* of FIG. 2) of the housing than the support sheet or the non-conductive member.

According to an embodiment, the non-conductive member may include a first portion (e.g., the first portion 421 of FIG. 7) facing the display and a second portion (e.g., the second portion 422 of FIG. 7) extending from the first portion.

According to an embodiment, the electronic device may further comprise a camera module (e.g., the camera module 401 of FIG. 5) disposed in the housing and a display driving circuit (e.g., the display driving circuit 402 of FIG. 5) disposed in the housing and configured to control an operation of the display. The waterproofing member may include a first waterproofing member (e.g., the first waterproofing member 431 of FIG. 5) surrounding at least a portion of the camera module and a second waterproofing member (e.g., the second waterproofing member 432 of FIG. 5) surrounding at least a portion of the display driving circuit. Each waterproofing member may comprise at least some waterproof and/or water resistant material.

According to an embodiment, the non-conductive member may surround at least a portion of a side surface (e.g., the side surface 300*a* of FIG. 8) of the display.

According to an embodiment, the electronic device may further comprise an adhesive member (e.g., the adhesive member 440 of FIG. 7) connecting the conductive plate and the housing. The non-conductive member may be disposed on a side surface of the conductive plate. The adhesive member may be disposed under, directly or indirectly, the conductive plate.

While the disclosure has been illustrated and described with reference to various embodiments, it will be understood that the various embodiments are intended to be illustrative, not limiting. It will further be understood by those skilled in the art that various changes in form and detail may be made without departing from the full scope of the disclosure, including the appended claims and their equivalents. It will also be understood that any of the embodiment(s) described herein may be used in conjunction with any other embodiment(s) described herein.

What is claimed is:
1. An electronic device comprising:
a housing including a first housing and a second housing;
a display disposed on the first housing and the second housing;
a hinge structure connecting the first housing and the second housing;
a conductive plate supporting the display;

a non-conductive member, comprising non-conductive material, at least partially surrounding at least a portion of the conductive plate; and
a waterproofing member, comprising waterproof material, at least partially disposed between at least the non-conductive member and the housing,
wherein a topmost surface of the non-conductive member is substantially coplanar with a topmost surface of the conductive plate, and
wherein a portion of the non-conductive member is disposed between the waterproofing member and the display and another portion of the non-conductive member protrudes with respect to the display in a direction away from the conductive plate such that when viewed from above, the another portion of the non-conductive member does not overlap the display.

2. The electronic device of claim 1, wherein the non-conductive member includes a first portion supporting the display and a second portion extending from the first portion.

3. The electronic device of claim 1, wherein the non-conductive member surrounds at least a portion of a side surface of the display.

4. The electronic device of claim 1, wherein the waterproofing member is attached to the conductive plate and the non-conductive member.

5. The electronic device of claim 1, further comprising:
a camera module, comprising a lens and circuitry, disposed in the housing; and
a display driving circuit disposed in the housing and configured to control an operation of the display,
wherein the waterproofing member includes a first waterproofing member surrounding at least a portion of the camera module and a second waterproofing member surrounding at least a portion of the display driving circuit.

6. The electronic device of claim 1, further comprising a digitizer disposed on the conductive plate.

7. The electronic device of claim 1, further comprising an adhesive member connecting the conductive plate and the housing.

8. The electronic device of claim 7,
wherein the non-conductive member is disposed on a side surface of the conductive plate, and
wherein the adhesive member is disposed under the conductive plate.

9. The electronic device of claim 1, wherein the conductive plate includes at least one recess, and
wherein the non-conductive member includes a protruding portion received in the at least one recess.

10. The electronic device of claim 1, wherein the display includes a first display area disposed on the first housing, a second display area disposed on the second housing, and a folding area positioned between at least the first display area and the second display area and at least partially facing the hinge structure.

11. The electronic device of claim 10, further comprising a support sheet supporting the display and including at least one opening facing at least a portion of the folding area.

12. The electronic device of claim 11, wherein the non-conductive member is disposed closer to the side surface of the housing than the support sheet or the conductive plate.

13. The electronic device of claim 1, further comprising a protection member surrounding at least a portion of the display.

14. The electronic device of claim 13, further comprising a first space at least partially surrounded by the housing, the display, and the protection member, wherein at least a portion of the non-conductive member is disposed in the first space.

15. The electronic device of claim 1, wherein the display includes a protection film for protecting an outer surface of the display, a window member supporting the protection film, and a display panel disposed under the window member.

16. An electronic device comprising:

a housing including a first housing and a second housing;

a display including a first display area disposed on the first housing, a second display area disposed on the second housing, and a folding area positioned between at least the first display area and the second display area;

a support sheet supporting the display and including at least one opening facing the folding area;

a digitizer disposed under the support sheet;

a conductive plate disposed under the digitizer;

a non-conductive member, comprising non-conductive material, surrounding at least a portion of the conductive plate; and a waterproofing member, comprising water resistant material, at least partially disposed between the non-conductive member and the housing, wherein a topmost surface of the non-conductive member is substantially coplanar with a topmost surface of the conductive plate, and wherein at least a portion of the non-conductive member protrudes outward from the conductive plate and is thereby disposed closer to a side surface of the housing than at least one of the support sheet or another portion of the non-conductive member disposed under the digitizer.

17. The electronic device of claim 16, wherein the non-conductive member includes a first portion facing the display and a second portion extending from the first portion.

18. The electronic device of claim 16, further comprising:

a camera module, comprising a lens and circuitry, disposed in the housing; and a display driving circuit disposed in the housing and configured to control an operation of the display, wherein the waterproofing member includes a first waterproofing member surrounding at least a portion of the camera module and a second waterproofing member surrounding at least a portion of the display driving circuit.

19. The electronic device of claim 16, wherein the non-conductive member surrounds at least a portion of a side surface of the display.

20. The electronic device of claim 16, further comprising:

an adhesive member, comprising adhesive, connecting the conductive plate and the housing, wherein the non-conductive member is disposed on a side surface of the conductive plate, and wherein the adhesive member is disposed under the conductive plate.

* * * * *